(12) United States Patent
Pershing et al.

(10) Patent No.: US 8,078,436 B2
(45) Date of Patent: Dec. 13, 2011

(54) AERIAL ROOF ESTIMATION SYSTEMS AND METHODS

(75) Inventors: Chris Pershing, Bellevue, WA (US); David P. Carlson, Woodinville, WA (US)

(73) Assignee: Eagle View Technologies, Inc., Redmond, WA (US)

( * ) Notice: Subject to any disclaimer, the term of this patent is extended or adjusted under 35 U.S.C. 154(b) by 532 days.

(21) Appl. No.: 12/253,092

(22) Filed: Oct. 16, 2008

(65) Prior Publication Data

US 2009/0132436 A1    May 21, 2009

Related U.S. Application Data

(63) Continuation-in-part of application No. 12/148,439, filed on Apr. 17, 2008.

(60) Provisional application No. 60/925,072, filed on Apr. 17, 2007.

(51) Int. Cl.
*G06F 7/60* (2006.01)
*G06F 17/10* (2006.01)

(52) U.S. Cl. .......................................... 703/2

(58) Field of Classification Search ...... 703/2; 705/306, 705/313, 4
See application file for complete search history.

(56) References Cited

U.S. PATENT DOCUMENTS

| | | | | |
|---|---|---|---|---|
| 5,633,995 | A | 5/1997 | McClain | 395/119 |
| 6,323,885 | B1 | 11/2001 | Wiese | 345/835 |
| 6,385,541 | B1 | 5/2002 | Blumberg et al. | 701/213 |
| 6,396,491 | B2 | 5/2002 | Watanabe et al. | 345/419 |
| 6,446,053 | B1 | 9/2002 | Elliott | 705/400 |
| 6,496,184 | B1 | 12/2002 | Freeman et al. | 345/419 |
| 6,636,803 | B1 | 10/2003 | Hartz, Jr. et al. | 701/208 |
| 6,836,270 | B2 | 12/2004 | Du | 345/419 |
| 6,980,690 | B1 | 12/2005 | Taylor et al. | 382/154 |
| 7,003,400 | B2 | 2/2006 | Bryant | 702/5 |
| 7,006,977 | B1 | 2/2006 | Attra et al. | 705/1 |

(Continued)

FOREIGN PATENT DOCUMENTS

AU    2008230031 B8    11/2009

(Continued)

OTHER PUBLICATIONS

Henricsson et al., 3-D Building Reconstruction with Aruba: A Qualitative and Quantitative Evaluation, 2001, Institute of Geodesy and Photogrammetry, pp. 1-12.*

(Continued)

*Primary Examiner* — Dwin M Craig
*Assistant Examiner* — Bernard E Cothran
(74) *Attorney, Agent, or Firm* — Seed IP Law Group PLLC

(57) ABSTRACT

Methods and systems for roof estimation are described. Example embodiments include a roof estimation system, which generates and provides roof estimate reports annotated with indications of the size, geometry, pitch and/or orientation of the roof sections of a building. Generating a roof estimate report may be based on one or more aerial images of a building. In some embodiments, generating a roof estimate report of a specified building roof may include generating a three-dimensional model of the roof, and generating a report that includes one or more views of the three-dimensional model, the views annotated with indications of the dimensions, area, and/or slope of sections of the roof. This abstract is provided to comply with rules requiring an abstract, and it is submitted with the intention that it will not be used to interpret or limit the scope or meaning of the claims.

56 Claims, 13 Drawing Sheets

U.S. PATENT DOCUMENTS

| | | | |
|---|---|---|---|
| 7,133,551 B2 | 11/2006 | Chen et al. | 382/154 |
| 7,324,666 B2 | 1/2008 | Zoken et al. | 382/113 |
| 7,343,268 B2 | 3/2008 | Kishikawa | 703/1 |
| 2002/0154174 A1 | 10/2002 | Redlich et al. | 345/848 |
| 2003/0014224 A1* | 1/2003 | Guo et al. | 703/1 |
| 2003/0028393 A1 | 2/2003 | Coulston et al. | 705/1 |
| 2003/0115163 A1* | 6/2003 | Moore et al. | 705/500 |
| 2003/0171957 A1 | 9/2003 | Watrous | 705/4 |
| 2003/0233310 A1 | 12/2003 | Stavrovski | 705/37 |
| 2004/0047498 A1 | 3/2004 | Mulet-Parada et al. | 382/128 |
| 2004/0105573 A1 | 6/2004 | Neumann et al. | 382/103 |
| 2004/0220906 A1 | 11/2004 | Gargi et al. | 707/3 |
| 2005/0203768 A1 | 9/2005 | Florance et al. | 705/1 |
| 2005/0288959 A1 | 12/2005 | Eraker et al. | 705/1 |
| 2006/0200311 A1 | 9/2006 | Arutunian et al. | 701/210 |
| 2006/0232605 A1 | 10/2006 | Imamura | 345/619 |
| 2006/0262112 A1 | 11/2006 | Shimada | 345/419 |
| 2006/0265287 A1 | 11/2006 | Kubo | 705/26 |
| 2007/0150366 A1 | 6/2007 | Yahiro et al. | 705/26 |
| 2008/0021683 A1 | 1/2008 | Rahmes et al. | 703/7 |
| 2008/0105045 A1 | 5/2008 | Woro | 73/170.27 |
| 2008/0221843 A1 | 9/2008 | Shenkar et al. | 703/1 |
| 2008/0262789 A1 | 10/2008 | Pershing et al. | 702/156 |
| 2008/0310756 A1 | 12/2008 | Tao et al. | 382/285 |
| 2009/0132210 A1 | 5/2009 | Royan et al. | 703/1 |
| 2009/0304227 A1 | 12/2009 | Kennedy et al. | 382/100 |
| 2010/0110074 A1 | 5/2010 | Pershing | 345/423 |
| 2010/0114537 A1 | 5/2010 | Pershing | 703/1 |
| 2011/0187713 A1 | 8/2011 | Pershing et al. | 345/420 |

FOREIGN PATENT DOCUMENTS

| | | | |
|---|---|---|---|
| EP | 2 251 833 A2 | 11/2010 |
| WO | 00/29806 | 5/2000 |
| WO | WO 2005/124276 A2 | 12/2005 |
| WO | WO 2006/040775 A2 | 4/2006 |
| WO | WO 2006/090132 A2 | 8/2006 |
| WO | WO 2011/094760 A2 | 8/2011 |

OTHER PUBLICATIONS

Pictometry, Frequently Asked Questions, Aug. 1, 2005, Wayback machine, pp. 1-6.*

Lueders letter dated Feb. 10, 2009, 3 pages.

"Pictometry—In the News," http://204.8.121.114/pressrelease%20archived/pressrelease_aec.asp, retrieved Feb. 6, 2009, 3 pages, Exhibit A.

"YouTube—Pictometry Online Demo," http://www.youtube.com/watch?v=jURSK7o0OD0, retrieved Feb. 6, 2009, 1 page, Exhibit B.

YouTube Video—Pictometry Online Demo—DVD, Feb. 25, 2010.

Schutzberg et al., "Microsoft's MSN Virtual Earth: The Map is the Search Platform," Directions Magazine, http://www.directionsmag.com/article.php?article_id=873&trv=1, retrieved Feb. 6, 2009, 10 pages, Exhibit C.

Miller, M., et al., "Miller's Guide to Framing and Roofing," 2005, McGraw Hill, pp. 131-136 and 162-163, Exhibit D.

Gulch, E., et al., "On the Performance of Semi-Automatic Building Extraction," In the International Archives of Photogrammetry and Remote Sensing, vol. 32, 1998, 8 pages, Exhibit F.

"Autodesk—Autodesk ImageModeler—Features," http://usa.autodesk.com/adsk/servlet/index?siteID=123112&id=115639. . ., retrieved Sep. 30, 2008, 1 page.

"Automatic House Reconstruction," http://www.vision.ee.ethz.ch/projects/Amobe_I/recons.html, retrieved Sep. 29, 2008, 7 pages.

Baillard, C. et al., "Automatic reconstruction of piecewise planar models from multiple views," CVPR99, vol. II, 1999, pp. 559-565.

Bignone, F. et al., "Automatic Extraction of Generic House Roofs from High Resolution Aerial Imagery," In: Proc. ECCV, 1996, 12 pages.

Chevrier, C. et al., "Interactive 3D Reconstruction for Urban Areas," CAAD Futures, 2001, pp. 1-13.

Debevec, Paul E. et al., "Modeling and Rendering Architecture from Photographs: A hybrid geometry-and image-based approach," www.cs.berkeley.edu/~malik/papers/debevecTM96.pdf., 1996, 10 pages.

Faugeras, O. et al., "3D Reconstruction of Urban Scenes from Sequences of Images," INRIA, No. 2572, Jun. 1995, 26 pages.

Henricsson, O. et al., "3-D Building Reconstruction with ARUBA: A Qualitative and Quantitative Evaluation," ftp://igpho.ethz.ch/pub/manos/papers/HenrO97Ascona.pdf, 1997, 12 pages.

Noronha, S. et al., "Detection and Modeling of Buildings from Multiple Aerial Images," IEEE Trans. On Pattern Analysis and Machine Intelligence, vol. 23, Issue 5, pp. 501-518, May 2001.

"PhotoModeler—Measure and Model Real—World Objects from Photographs," http://www.photomodeler.com/products/photomodeler.htm, retrieved Sep. 30, 2008, 2 pages.

Poullis, C. et al., "Photogrammetric Modeling and Image-Based Rendering for Rapid Virtual Environement Creation," http://handle.dtic.mil/100.2/ADA433420, 1998, 7 pages.

Scholze, S. et al., "A Probabilistic Approach to Building Roof Reconstruction Using Semantic Labelling," Pattern Recognition, Springer Berlin/Heidelberg, vol. 2449/2002, 2002, 8 pages.

Ziegler, R, et al. "3D Reconstruction Using Labeled Image Regions," Mitsubishi Electric Research Laboratories, http://www.merl.com, 2003, 14 pages.

Delaney, "Searching for Clients from Above", The Wall Street Journal, Jul. 31, 2007, 3 pages.

Precigeo, "Welcome to precigeo™", www.precigeo.com, 2006, downloaded Feb. 26, 2010, 5 pages.

Office Action, for U.S. Appl. No. 12/148,439, mailed Aug. 16, 2010, 47 pages.

Office Action, for U.S. Appl. No. 12/148,439, mailed Apr. 25, 2011, 52 pages.

Pictometry, "Electronic Field Study™ Getting Started Guide," Version 2.7, Jul. 2007, 15 pages.

Pictometry, "FAQs," retrieved on Aug. 8, 2011, from http://www.web.archive.org/web/20080922013233/http:/www.pictometry.com/about_us/faqs.sht. . ., 3 pages.

Pictometry Online, "Government," retrieved Aug. 8, 2011, from http://web.archive.org/web/20081007111115/http:/www.pictometry.com/government/prod. . ., 3 pages.

Australian Office Action for Australian Application No. 2010201839, dated Apr. 14, 2011, 2 pages.

International Search Report for International Application No. PCT/US11/23408, mailed Aug. 11, 2011, 2 pages.

Mann, "Roof with a view," Contract Journal 431(6552):29, Nov. 23, 2005, 2 pages.

Office Action, for U.S. Appl. No. 12/148,439, mailed Aug. 25, 2011, 77 pages.

Office Action for U.S. Appl. No. 12/467,244, mailed Aug. 26, 2011, 17 pages.

Office Action for U.S. Appl. No. 12/467,250, mailed Sep. 7, 2011, 14 pages.

Written Opinion, for International Application No. PCT/US11/23408, mailed Aug. 11, 2011, 5 pages.

Precigeo.com, "Welcome to precigeo™," "Welcome to precigeoRoof," "Why precigeoRoof," "How precigeoRoof Works," "How precigeoRoof Can Help Me," all retrieved on Feb. 26, 2010, from http://web.archive.org/, pp. 1-5; "Why precigeoRisk Works" and "Welcome to precigeoRisk," retrieved on Aug. 14, 2010, from http://web.archive.org, pp. 6-11. (11 pages total).

* cited by examiner

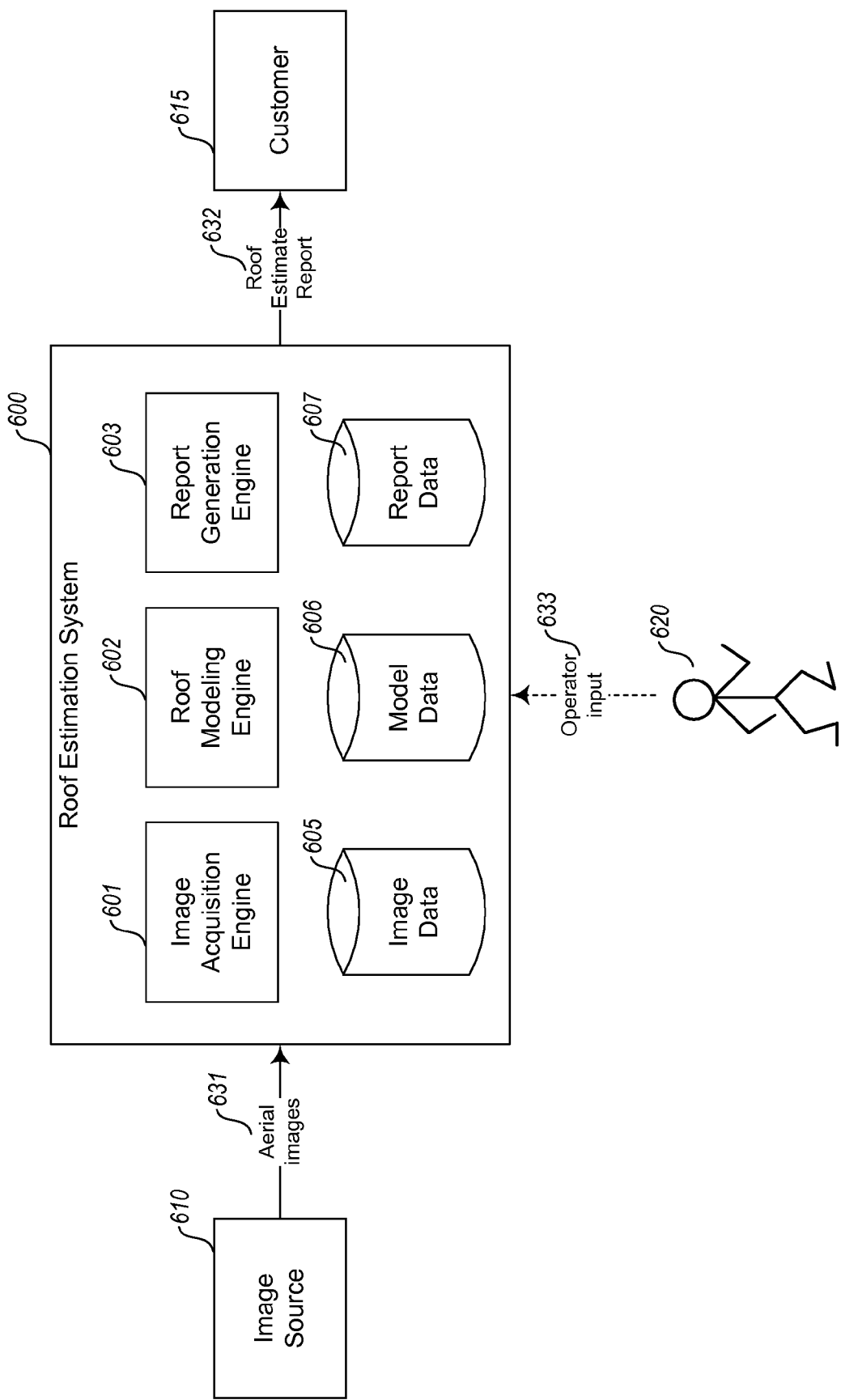

AERIAL ROOF ESTIMATION SYSTEMS AND METHODS

CROSS REFERENCE TO RELATED APPLICATIONS

This application is a continuation-in-part of U.S. patent application Ser. No. 12/148,439, filed on Apr. 17, 2008, which claims the benefit of U.S. Provisional Patent Application No. 60/925,072, filed on Apr. 17, 2007, each of which are incorporated herein by reference in their entireties.

BACKGROUND

1. Field of the Invention

This invention relates to systems and methods for estimating construction projects, and more particularly, to such systems and methods that allow estimates involving roofs on buildings to be created remotely.

2. Description of the Related Art

The information provided below is not admitted to be part of the present invention, but is provided solely to assist the understanding of the reader.

Homeowners typically ask several roofing contractors to provide written estimates to repair or replace a roof on a house. Heretofore, the homeowners would make an appointment with each roofing contractor to visit the house to determine the style of roof, take measurements, and to inspect the area around the house for access and cleanup. Using this information, the roofing contractor then prepares a written estimate and then timely delivers it to the homeowner. After receiving several estimates from different rooting contractors, the homeowner then selects one.

There are factors that impact a roofing contractor's ability to provide a timely written estimate. One factor is the size of the roof contractor's company and the location of the roofing jobs currently underway. Most roof contractors provide roofing services and estimates to building owners over a large geographical area. Larger roof contractor companies hire one or more trained individuals who travel throughout the entire area providing written estimates. With smaller roofing contractors, the owner or a key trained person is appointed to provide estimates. With both types of companies, roofing estimates are normally scheduled for buildings located in the same area on a particular day. If an estimate is needed suddenly at a distant location, the time for travel and the cost of commuting can be prohibitive. If the roofing contractor is a small company, the removal of the owner or key person on a current job site can be time prohibitive.

Another factor that may impact the roofing contractor's ability to provide a written estimate is weather and traffic.

Recently, solar panels have become popular. In order to install solar panels, the roof's slope, geometrical shape, and size as well as its orientation with respect to the sun all must be determined in order to provide an estimate of the number and type of solar panels required. Unfortunately, not all roofs on a building are proper size, geometrical shape, or orientation for use with solar panels.

SUMMARY

These and other objects are met by the system and method disclosed herein that allows a company that needs the sizes, dimensions, slopes and orientations of the roof sections on a building in order to provide a written estimate. A roof estimation system ("RES") that practices at least some of the techniques described herein may include a roof estimating software program and a location-linked, image file database. During use, the physical address or location information of a building is provided to the program, which then presents aerial images of roof sections on the building at the specific address location. An overhead aircraft, a balloon, or satellite may produce the aerial images. An image analysis and calibration is then performed either manually and/or via a software program that determines the geometry, the slopes, the pitch angles, and the outside dimensions of the roof sections. The images may also include the land surrounding the roof sections and building which the estimating company can use to factor in additional access or clean-up costs.

In a first embodiment of the roof estimation system, a roof estimation service is contacted by a potential customer requesting an estimate for repair or replacement of a roof on a building. The roof estimation service uses a local computer with an estimating software program loaded into its working memory to access an image file database located on the computer or on a remote server connected via a wide area network to the local computer. The image file database contains image files of various buildings. When a request for an estimate is received from a potential customer, the roof estimation service enters the customer's address into the software program and aerial images of the building are then presented to the roof estimation service. The roof estimation service then manually measures or uses a roof estimation software program to determine the slopes, dimensions, and other relevant geometric information of the roof sections on the buildings. From these determinations, the overall shape, slopes and square footage of the roof sections are determined and a report is produced. After the report has been prepared, the images are reviewed again for special access and cleanup tasks which can be added to the final estimate before transmission to the potential customer.

In another embodiment, the roof estimate software program and image file database, operated by a roof estimation service, are both stored on one or more a remote computers and accessed by a roof company, via a wide area network. The roof company uses an assigned user name and password to log onto the Web site and accessed the computer. After logging on, the roof company submits an address of a building, other relevant job related information, and a request for a report from the roof estimation service. The roof estimation service associated with the Web site uses the address information to obtain the images of the roof sections on the building(s) and uses the roof estimation software program and calibration module to determine the relevant geometry, pitch angles, dimensions, and surface areas of the building's roof. The roof estimation service then produces and sends a report to the roof company. The roof company then uses the report to prepare a final estimate that is then delivered to its potential customer.

In another embodiment, a roof estimating Web site is created designed to receive requests for roof estimates directly from potential customers in a region. The roof estimation service that operates the Web site is associated with various roof companies that provide roof-related services in the region serviced by the Web site. When a potential customer contacts the Web site and requests an estimate for a roof repair, replacement or installation of equipment, the potential's customer's name, address, and contact information is first submitted on the Web site. The estimation service representative enters the address of the building into the roof estimation software program. The aerial images of the buildings are then obtained and analyzed by the service representative to extract the relevant geometric information about the structures. A report containing the geometric information obtained from the aerial images and other relevant project related information supplied by the potential customer are transmitted to roof companies associated with the estimation service. The roof company reviews the information then prepares an estimate which then can be uploaded to the roof estimating Web site server which then forwards the estimate to the potential customer, or sent from the roof company directly via email, fax or mail to the potential customer.

In another embodiment, a roof estimation service associated with the roof estimate Web site uses the image file database and roof estimate software to preemptively calculate and store the dimensions, areas, pitch angles, and other relevant geometric information about the buildings and structures located within a geographic region. This pre-calculated information can then be used by any of the previously mentioned embodiments to accelerate the process of obtaining roof estimates within that geographic region.

It should be understood, that the systems and methods described herein may be used by any individual or company that would find the calculation of the size, geometry, pitch and orientation of the roof of a building from aerial images of the building useful. Such companies may include roofing companies, solar panel installers, roof gutter installers, awning companies, HVAC contractors, general contractors, and insurance companies.

BRIEF DESCRIPTION OF THE DRAWINGS

FIG. 6 is a block diagram illustrating example functional elements of one embodiment of a roof estimation system.

DETAILED DESCRIPTION

Figure 1:
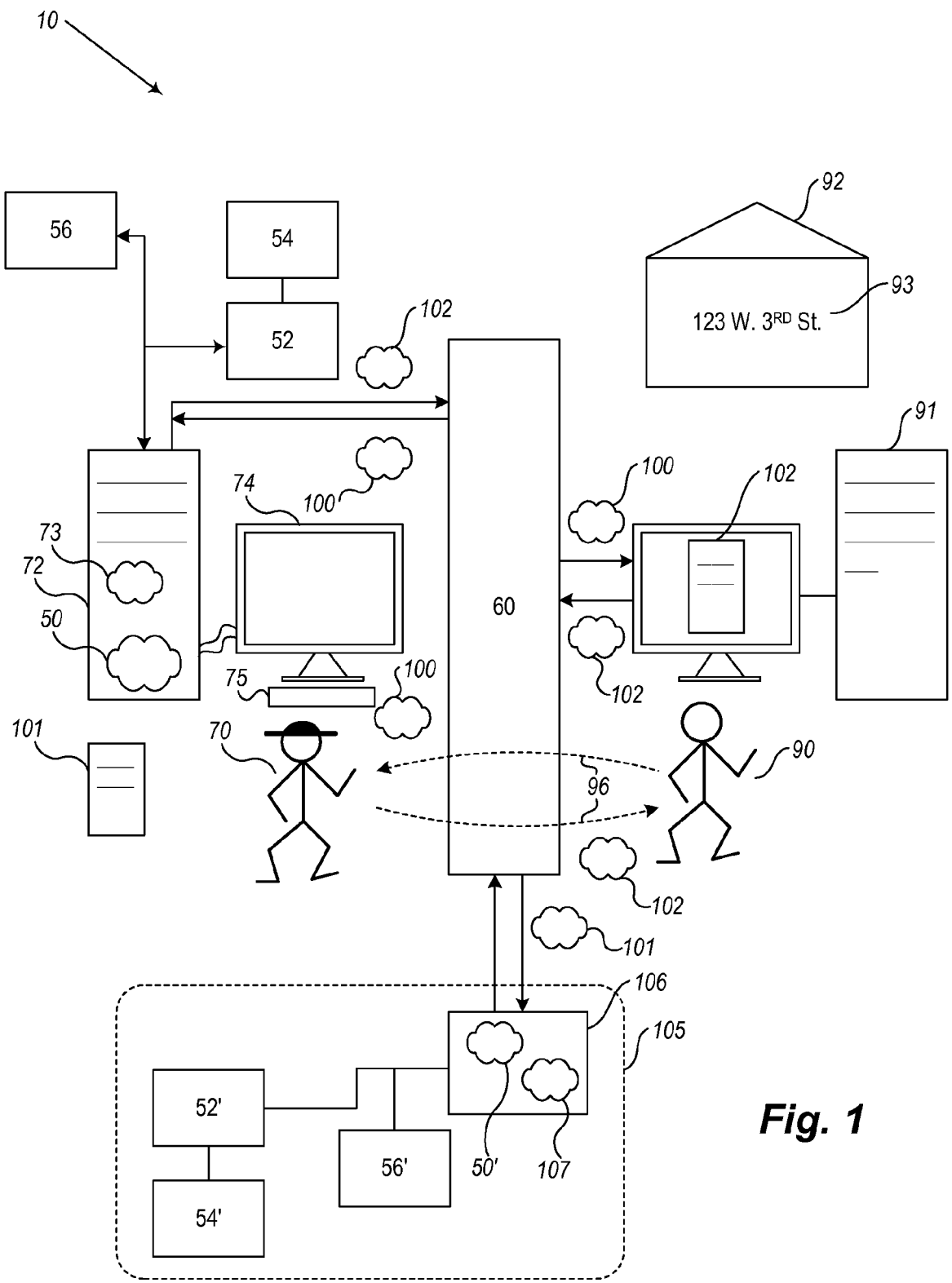
FIG. 1 is an illustration showing embodiments of a system and method for roof estimation.
Figure 3:
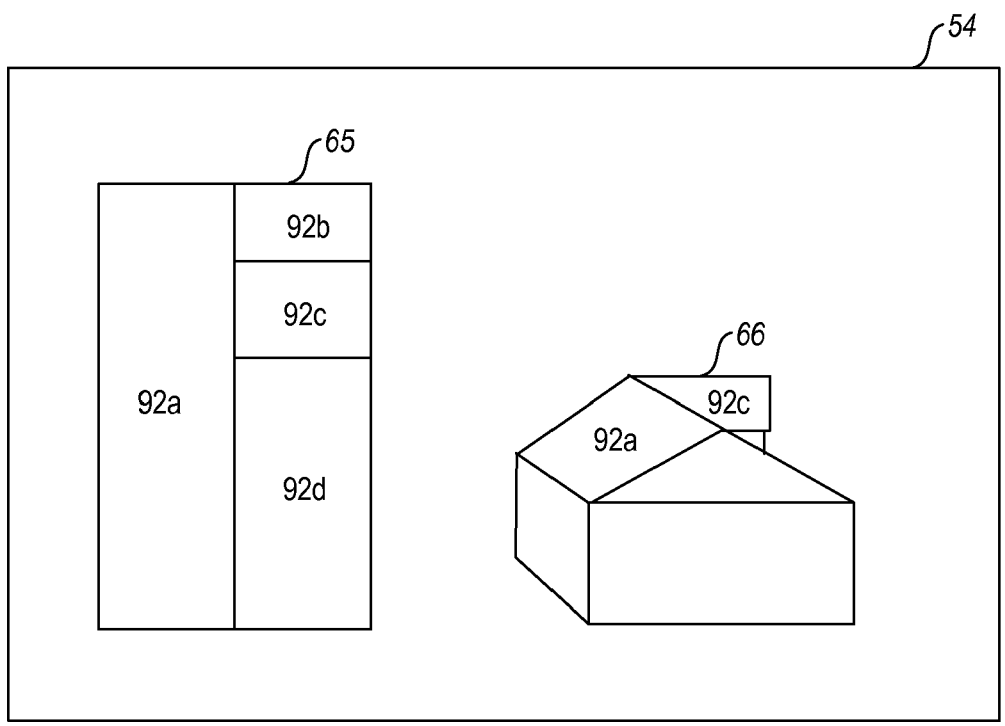
FIG. 3 is an illustration showing the top and perspective view of a house for a particular address.

Referring to the accompanying Figures, there is described a roof estimation system ("RES") 10 and method that allows a roof estimation service 70 to provide a final estimate 102 to a potential customer 90 to install equipment or to repair or replace the roof on a building 92 using aerial images of the building 92, as shown in FIG. 1. The roof estimation service 70 may be any service that provides roof estimates to customers. In one embodiment, the roof estimation service 70 typically provides roof estimates to customers who are roof companies or other entities involved in the construction and/or repair of roofs, such as builders, contractors, etc. In another embodiment, the roof estimation service 70 is a roof company that is directly involved in the construction and/or repair of roofs, and that provides estimates to customers that are property owners, general contractors, etc. The system 10 includes an estimating software program 50 designed to receive an address for the building 92. The software program 50 is linked to an aerial image file database 52 that contains aerial images files 54 of various building 92 in a region. The aerial image files 54 may be taken any available means, such as a manned or unmanned aircraft, a balloon, a satellite, etc. In some embodiments, the aerial image files may include images taken from a ground-based platform, such as a mobile ("street view") photography vehicle, a fixed position (e.g., a tower, nearby building, hilltop, etc.), etc. As shown in FIG. 3, the image files 54 typically include at least one a top plan view 65 and a perspective view 66 of the building 92. The roof of the building 92 includes multiple planar roof sections 92a-92d.

Figure 4:
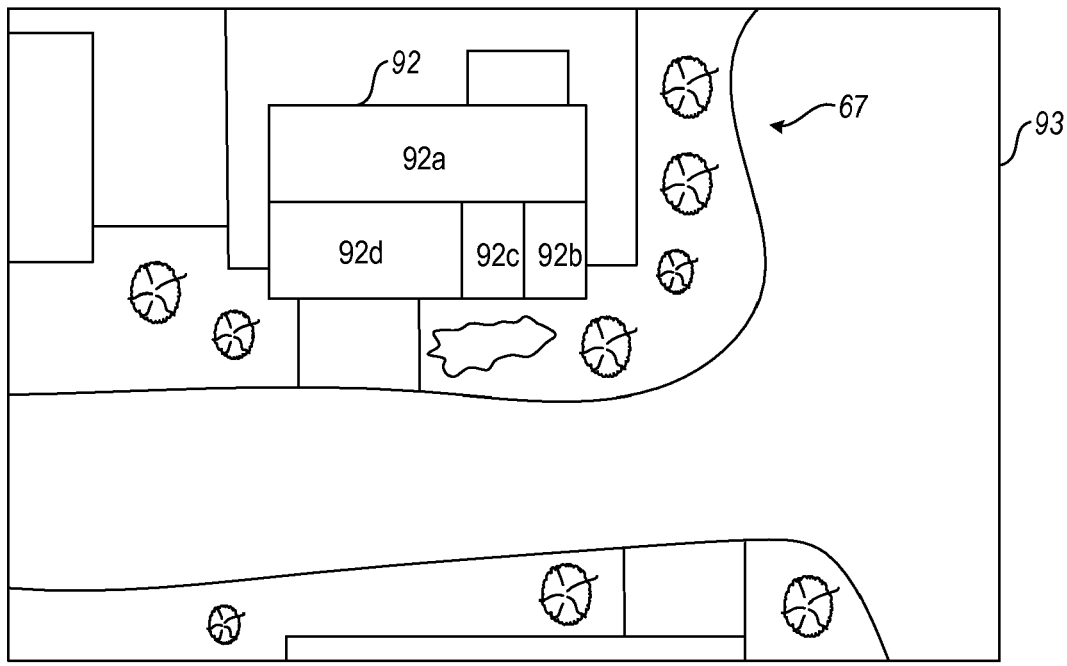
FIG. 4 is an aerial image of the home shown in FIG. 3 showing the areas and structures around the home.

As shown in FIG. 4, the image files 54 may also include a wide angle image 67 showing the building 92 and the surrounding areas 93 around the building 92.

Referring back to FIG. 1, in one embodiment, an image analysis and calibration module 56 is linked to the software program 50 that enables the roof estimation service 70 to closely estimate the dimensions and slopes of the roofs of the buildings 92 shown in the views 65, 66. By simply inputting the customer's address into the software program 50, the roof estimation service 70 is able view the customer's roof from the aerial image files 54 using a remote computer 72, determine the dimensions and slopes of the roof sections that make up the roof, and prepare a preliminary report 101 which is then used to prepare a final estimate 102 that is then delivered to the potential customer 90.

FIG. 1 is an illustration showing the system 10 used by a potential customer 90 requesting a roof estimate from a roof estimation service 70 that uses the system 10 described above. The potential customer 90 may be the building tenant, owner or insurance company. The roof estimation service 70 uses a computer 72 which may connect to a wide area network 60. The customer 90 contacts the roof estimation service 70 via his or her computer 91 and the wide area network 60 or by a telecommunication network 96, and requests a roof estimate 100 for his building 92 located at a public address 93. (in this example, "123 W. 3rd St."). The roof estimation service 70 then processes the request 100 which leads to a final estimate 102 being delivered to the potential customer's computer 91 or via email, fax or postal service to the potential customer 90.

There are several different ways the system 10 can be setup. FIG. 1 shows a first embodiment of the system 10 where the roof estimation service 70 operates a remote computer 72 with a display 74 and a keyboard 75 or similar input means, such as a mouse, joystick, track pad, etc. A roof estimating software program 50 is loaded into the working memory 73 of the remote computer 72. The software program 50 is able to retrieve aerial images of buildings from the database 52 containing aerial images files 54 of buildings located in the region served by the roof estimation service 70. In the first embodiment shown in FIG. 1, the remote computer 72 is linked or connected to a database 52 containing aerial images files 54 of the buildings. The software program 50 includes a calibration module 56 that enables the roof estimation service 70 to determine the angles and dimensions of various roof sections shown in the images files 54. After the angles and dimensions are determined, the combined square footage of the building 92 can be determined which is then used to create a preliminary report 101. The roof estimation service 70 then reviews the wide angle image file 67 (see FIG. 4) to determine if the building 92 has special access and clean up factors that may impact the final estimate 102. Once the preliminary report 101 or the final estimate 102 is prepared by the roof estimation service 70, one or both can be transmitted to the customer 90 via the wide area network 60, the telecommunication network 96, or by postal service.

Also shown in FIG. 1 is an alternative setup of the system 10 wherein a preliminary report 101 is prepared by a separate roof estimating entity 105 which is then forwarded to the roof estimation service 70 who then prepares the final estimate 102 and sends it to the customer 90. The entity 105 includes a computer 106 with a roof estimating software program 50' loaded into the working memory 107. Like the software program 50 loaded into the roof contractor's computer 72 in the previous embodiment the software program 50' is also able to retrieve aerial images of houses from a database 52' containing aerial images files 54' of houses located in the region served by the roof estimation service 70. An optional calibration module 56' may be provided which enables the entity 105 to determine the angles and linear dimensions of various roof sections on the house 92.

When the system 10 is set up to include the estimating entity 105, the customer 90 may first contact the roof estimation service 70. The roof estimation service 70 may then contact the estimating entity 105 and forward the address of the building 92 thereto. The estimating entity 105 may then prepare the preliminary report 101 that is transmitted to the roof estimation service 70. The roof estimation service 70 may then prepare the final report 102 and send it to the customer 90. In other embodiments, interactions between the customer 90, the roof estimation service 70, and the estimating entity 105 may occur in different ways and/or orders. For example, the customer 90 may contact the estimating entity 105 directly to receive a final report 102, which the customer 90 may then forward to one or more roof companies of their choosing.

Figure 2:
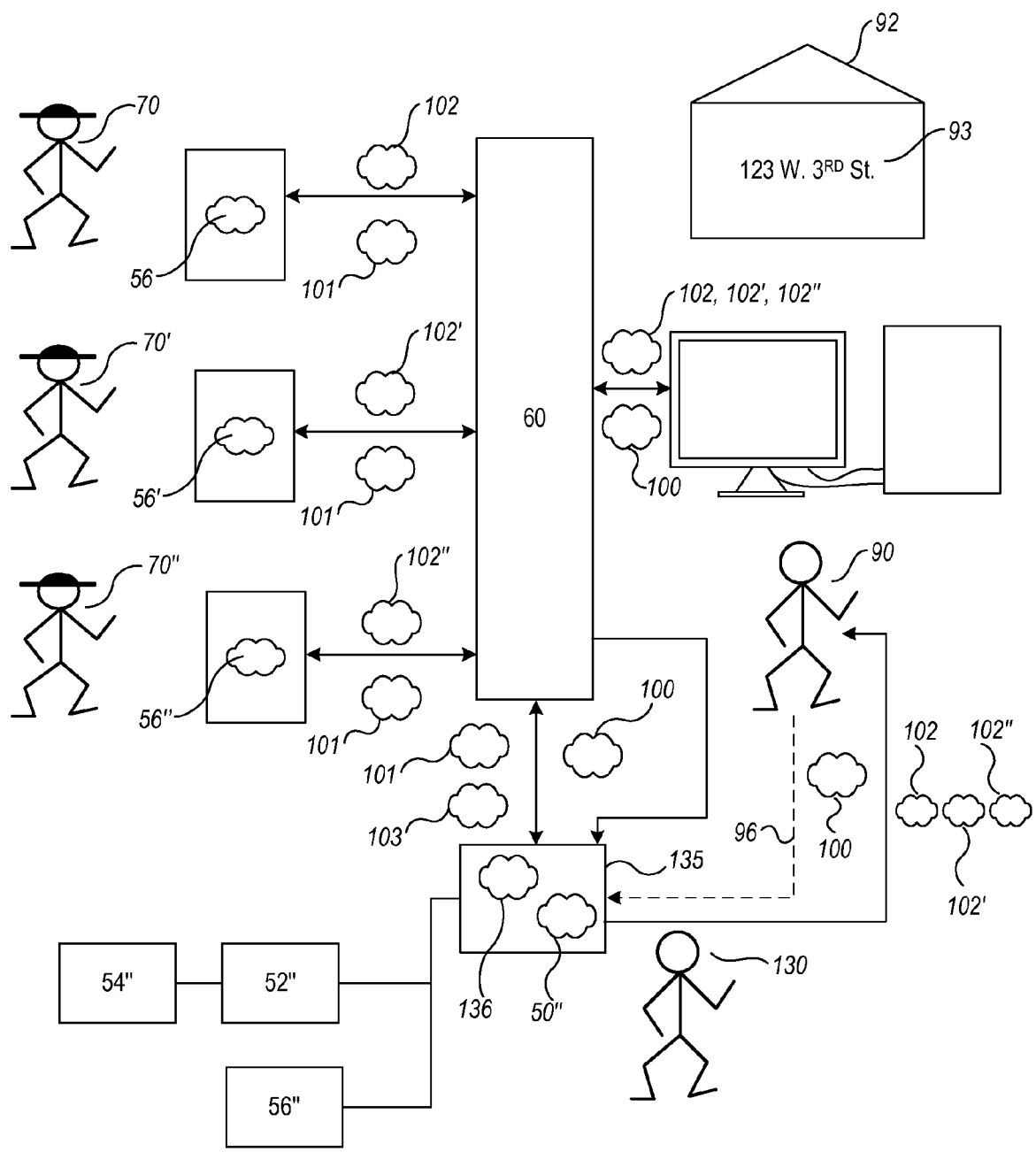
FIG. 2 is an illustration showing another embodiment of a system and method for roof estimation.

FIG. 2 shows a third embodiment of the system 10 where the customer 90 contacts a roof estimating entity 130 who receives a request 100 from the customer 90 via the wide area network 60 or telecommunication network 96. The roof estimating entity 130 prepares a preliminary report 101 which is then transmitted to various roof estimation services 70, 70', 70" associated with the entity 130. Accompanying the preliminary report 101 may be the name and contact telephone number(s) or email address of the customer 90. Each roof estimation service 70, 70', 70" reviews the preliminary report 101 and any associated images sent therewith and then prepares a final estimate 102, 102', 102". The final estimate 102, 102', 102" is then mailed, emailed or faxed to the customer 90 or back to the estimating entity 130. The estimating entity 130 then sends the final estimate 102, 102', 102" to the customer 90. In this embodiment, the estimating entity 130 includes a computer 135 in which the roof estimating software program 50" is loaded into its working memory 136 loaded and linked to the aerial image database 52" containing image files 54". An optional calibration module 56" may be loaded into the working memory 136 of the computer 135.

Figure 5A:
FIGS. 5A-5F are consecutive pages from a preliminary or final report sent to a potential customer prepared by the roofing company.
Figure 5B:
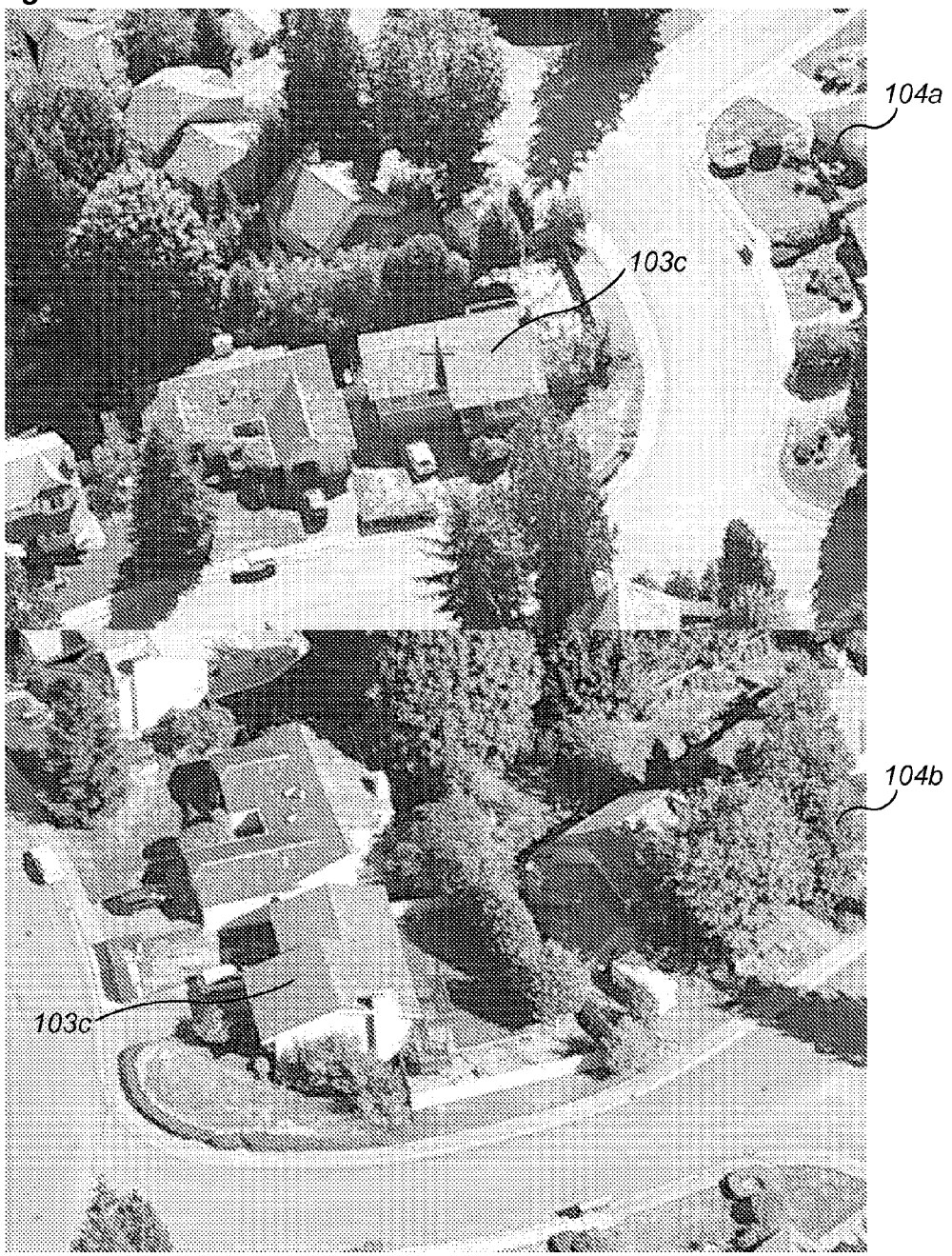
Figure 5C:
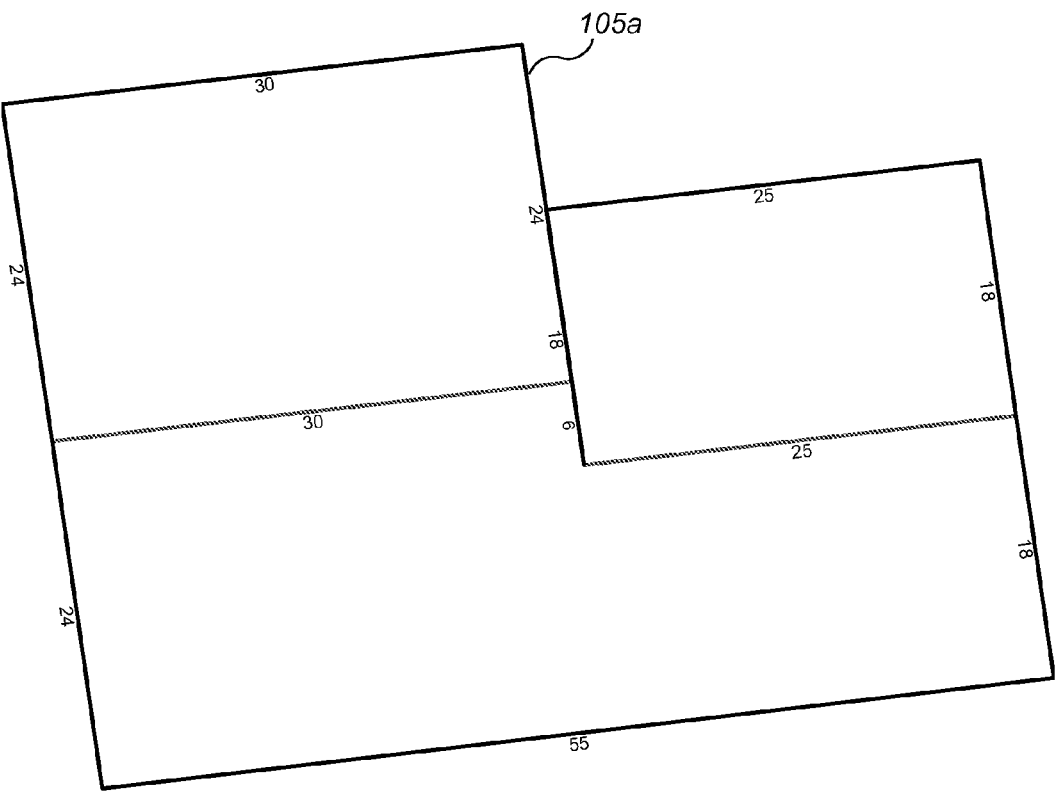
Figure 5D:
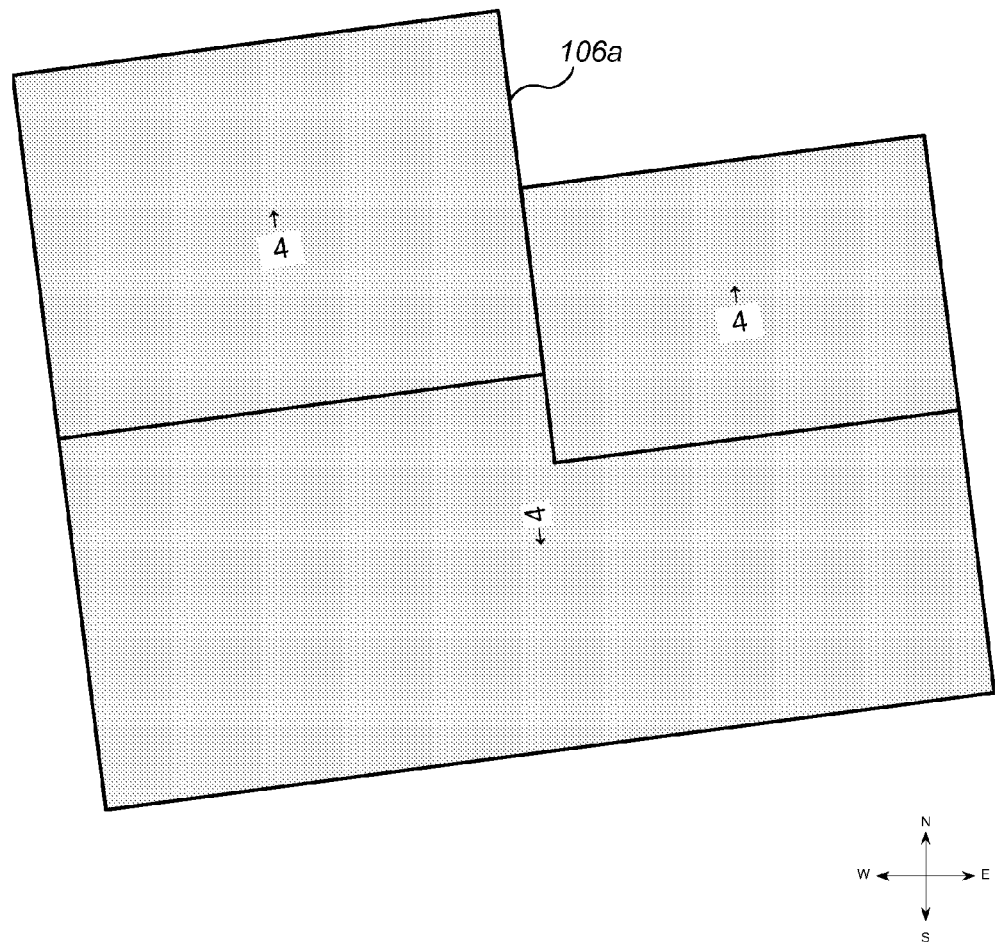
Figure 5E:
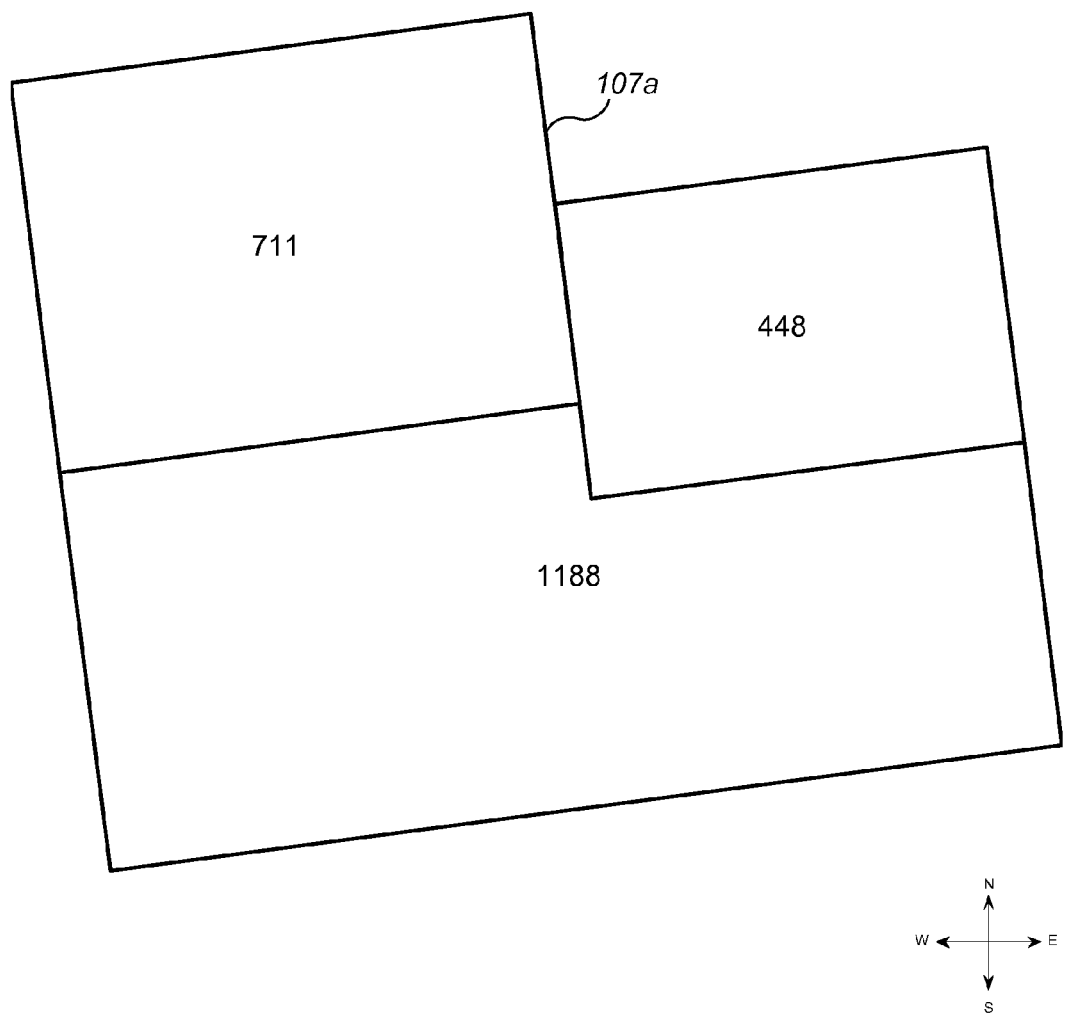
Figure 5F:
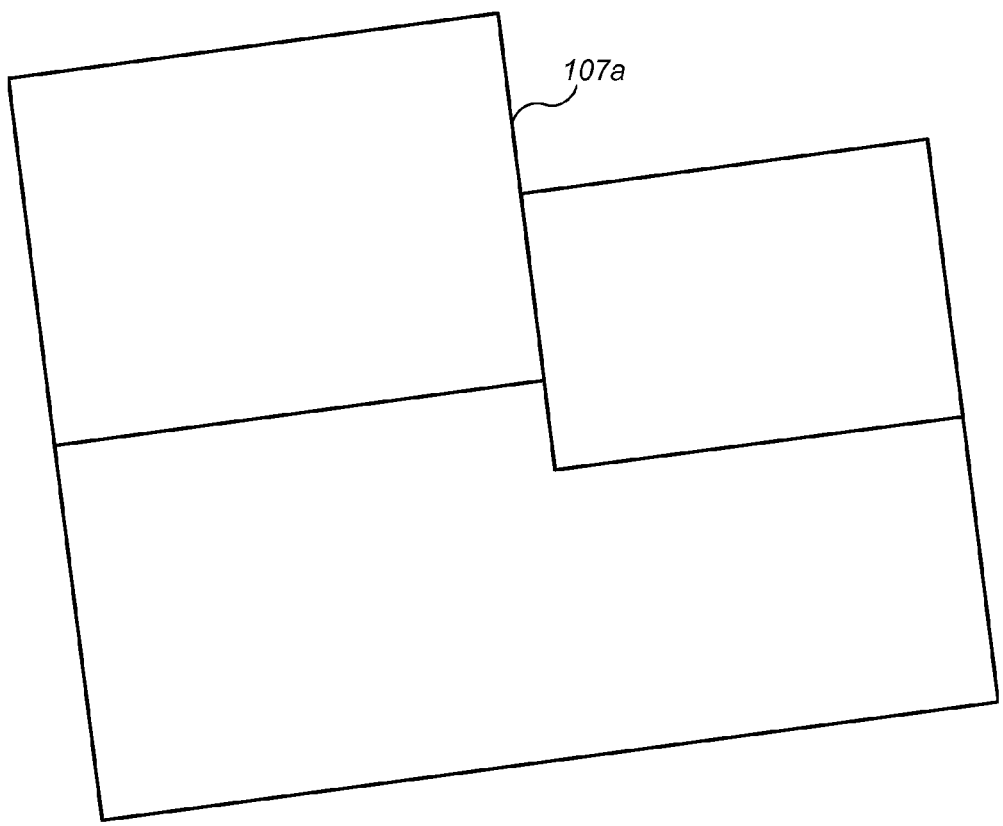

FIGS. 5A-5F are individual pages that make up a representative report. In FIG. 5A, a cover page 103 that lists the address 103a of a building 103c and an overhead aerial image 103b of the building 103c. In FIG. 5B, a second page 104 of the report is shown that shows two wide overhead perspective views 104a and 104b of the building 103c at the address with the surrounding areas more clearly shown. FIG. 5C is the third page 105 of the report which shows a line drawing 105a of the building showing ridge and valley lines, dimensions and a compass indicator. FIG. 5D is an illustration of the fourth page 106 of the report showing a line drawing 106a of the building showing the pitch of each roof section along with a compass indicator. The pitch in this example is given in inches, and it represents the number of vertical inches that the labeled planar roof section drops over 12 inches of horizontal run. The slope can be easily calculated from such a representation using basic trigonometry. The use of a numerical value of inches of rise per foot of run is a well known measure of slope in the roofing industry. A roof builder typically uses this information to assist in the repair and/or construction of a roof. Of course, other measures and/or units of slope may be utilized as well, including percent grade, angle in degrees, etc. FIG. 5E is an illustration of the fifth page 107 of the report showing a line drawing 107a of the building showing the square footage of each roof section along with the total square foot area value. FIG. 5F is an illustration of a sixth page 108 of the report showing a line drawing 108a of the building where notes or comments may be written.

Using the above roof estimation system, a detailed description of how the system may be used in one example embodiment is now provided.

First, a property of interest is identified by a potential customer of the roof estimation service 70. The customer may be a property owner, a roof construction/repair company, a contractor, an insurance company, a solar panel installer, etc. The customer contacts the roof estimation service with the location of the property. Typically, this will be a street address. The roof estimation service 70 may then use a geo-coding provider, operated by the service 70 or some third party, to translate the location information (such as a street address) into a set of coordinates that can be used to query an aerial or satellite image database. Typically, the geo-coding provider will be used to translate the customer supplied street address into a set of longitude-latitude coordinates.

Next, the longitude-latitude coordinates of the property may be used to query an aerial and/or satellite imagery database in order to retrieve one or more images of the property of interest. It is important to note that horizontal (non-sloping) flat roofs only require a single image of the property. However, few roofs (especially those on residential buildings) are horizontally flat, and often contain one or more pitched sections. In such cases, two or more photographs are typically used in order for the service 70 to identify and measure all relevant sections and features of the roof.

Once the images of the roof section of the building are obtained, at least one of the images may be calibrated. During calibration, the distance in pixels between two points on the image is converted into a physical length. This calibration information is typically presented as a scale marker on the image itself, or as additional information supplied by the image database provider along with the requested image. The image(s) and calibration information returned by the imagery database is entered or imported into measurement software of the service 70.

Next, a set of reference points may be identified in each of the images. The service's 70 measurement software then uses these reference points and any acceptable algorithm to co-register the images and reconstruct the three-dimensional geometry of the object identified by the reference points. There are a variety of photo-grammetric algorithms that can be utilized to perform this reconstruction. One such algorithm used by the service 70 uses photographs taken from two or more view points to "triangulate" points of interest on the object in three-dimensional ("3D") space. This triangulation can be visualized as a process of projecting a line originating from the location of the photograph's observation point that passes through a particular reference point in the image. The intersection of these projected lines from the set of observation points to a particular reference point identifies the location of that point in 3D space. Repeating the process for all such reference points allows the software to build a 3D model of the structure.

The optimal choice of reconstruction algorithm depends on a number of factors such as the spatial relationships between the photographs, the number and locations of the reference points, and any assumptions that are made about the geometry and symmetry of the object being reconstructed. Several such algorithms are described in detail in textbooks, trade journals, and academic publications.

Once the reconstruction of the building is complete, the results may be reviewed for completeness and correctness. If necessary, an operator of the service's 70 software will make corrections to the reconstructed model.

Information from the reconstructed model may then be used to generate a report containing information relevant to the customer. The information in the report may include total square footage, square footage and pitch of each section of roof, linear measurements of all roof segments, identification and measurement of ridges and valleys, and different elevation views rendered from the 3D model (top, side, front, etc.).

Using the above description, a method for estimating the size and the repair or replacement costs of a roof may include the following steps:

a. selecting a roof estimation system that includes a computer with a roof estimation software program loaded into its working memory, said roof estimation software uses aerial image files of buildings in a selected region and a calibration module that allows the size, geometry, and orientation of a roof section to be determined from said aerial image files;

b. submitting a request for a measurement of a roof of a building at a known location;

c. submitting the location information of a building with a roof that needs a size determination, a repair estimate, or replacement estimate;

d. entering the location information of said building and obtaining aerial image files of one or more roof sections used on a roof; and, e. using said calibration module to determine the size, geometry and pitch of each said roof section.

In the above method, the entity requesting the measurement may be a roof construction/repair company, the building tenant, the building owner, an insurance company, etc.

FIG. 6 is a block diagram illustrating example functional elements of one embodiment of a roof estimation system. In particular, FIG. 6 shows an example Roof Estimation System ("RES") 600 comprising an image acquisition engine 601, a roof modeling engine 602, a report generation engine 603, image data 605, model data 606, and report data 607. The RES 600 is communicatively coupled to an image source 610, a customer 615, and optionally an operator 620. The RES 600 and its components may be implemented as part of a computing system, as will be further described with reference to FIG. 7.

In the illustrated embodiment, the RES 600 performs some or all of the functions of the whole system described with reference to FIGS. 1 and 2, and also additional functions as described below. For example, the RES 600 may perform one or more of the functions of the software program 50, the roof estimating entity 105, the aerial image file database 52, and/or the calibration module 56.

More specifically, in the illustrated embodiment of FIG. 6, the RES 600 is configured to generate a roof estimate report 632 for a specified building, based on aerial images 631 of the building received from the image source 610. The image source 610 may be any provider of images of the building for which a roof estimate is being generated. In one embodiment, the image source 610 includes a computing system that provides access to a repository of aerial images of one or more buildings. The image acquisition engine 601 obtains one or more aerial images of the specified building by, for example, providing an indicator of the location of the specified building (e.g., street address, GPS coordinates, lot number, etc.) to the image source 610. In response, the image source 610 provides to the image acquisition engine 605 the one or more aerial images of the building. The image acquisition engine 601 then stores the received aerial images as image data 605, for further processing by other components of the RES 600. In some embodiments, the aerial images may include images obtain via one or more ground-based platforms, such as a vehicle-mounted camera that obtains street-level images of buildings, a nearby building, a hilltop, etc. In some cases, a vehicle-mounted camera may be mounted in an elevated position, such as a boom.

Next, the roof modeling engine 602 generates a model of the roof of the specified building. In the illustrated embodiment, the roof modeling engine 602 generates a three-dimensional model, although in other embodiments, a two-dimensional (e.g., top-down roof plan) may be generated instead or in addition. As noted above, a variety of automatic and semi-automatic techniques may be employed to generate a model of the roof of the building. In one embodiment, generating such a model is based at least in part on a correlation between at least two of the aerial images of the building. For example, the roof modeling engine 602 receives an indication of a corresponding feature that is shown in each of the two aerial images. In one embodiment, an operator 620, viewing two or more images of the building, inputs an indication in at least some of the images, the indications identifying which points of the images correspond to each other for model generation purposes.

The corresponding feature may be, for example, a vertex of the roof of the building, the corner of one of the roof planes of the roof, a point of a gable or hip of the roof, etc. The corresponding feature may also be a linear feature, such as a ridge or valley line between two roof planes of the roof. In one embodiment, the indication of a corresponding feature on the building includes "registration" of a first point in a first aerial image, and a second point in a second aerial image, the first and second points corresponding the substantially the same point on the roof of the building. Generally, point registration may include the identification of any feature shown in both aerial images. Thus, the feature need not be a point on the roof of the building. Instead, it may be, for example, any point that is visible on both aerial images, such as on a nearby building (e.g., a garage, neighbor's building, etc.), on a nearby structure (e.g., swimming pool, tennis court, etc.), on a nearby natural feature (e.g., a tree, boulder, etc.), etc.

In some embodiments, the roof modeling engine 602 determines the corresponding feature automatically, such as by employing on one or more image processing techniques used to identify vertexes, edges, or other features of the roof. In other embodiments, the roof modeling engine 602 determines the corresponding feature by receiving, from the human operator 620 as operator input 633, indications of the feature shown in multiple images of the building.

In addition, generating a 3D model of the roof of a building may include correcting one or more of the aerial images for various imperfections. For example, the vertical axis of a particular aerial image sometimes will not substantially match the actual vertical axis of its scene. This will happen, for example, if the aerial images were taken at different distances from the building, or at a different pitch, roll, or yaw angles of the aircraft from which the images were produced. In such cases, an aerial image may be corrected by providing the operator 620 with a user interface control operable to adjust the scale and/or relative angle of the aerial image to correct for such errors. The correction may be either applied directly to the aerial image, or instead be stored (e.g., as an offset) for use in model generation or other functions of the RES 600.

Generating a 3D model of the roof of a building further includes the automatic or semi-automatic identification of features of the roof of the building. In one embodiment, one or more user interface controls may be provided, such that the operator 620 may indicate (e.g., draw, paint, etc.) various features of the roof, such as valleys, ridges, hips, vertexes, planes, edges, etc. As these features are indicated by the operator 620, a corresponding 3D model may be updated accordingly to include those features. These features are identified by the operator based on a visual inspection of the images and by providing inputs that identify various features as valleys, ridges, hips, etc. In some cases, a first and a second image view of the roof (e.g., a north and east view) are simultaneously presented to the operator 620, such that when the operator 620 indicates a feature in the first image view, a projection of that feature is automatically presented in the second image view. By presenting a view of the 3D model, simultaneously projected into multiple image views, the operator 620 is provided with useful visual cues as to the correctness of the 3D model and/or the correspondence between the aerial images.

In addition, generating a 3D model of the roof of a building may include determining the pitch of one or more of the sections of the roof. In some embodiments, one or more user interface controls are provided, such that the operator 620 may accurately determine the pitch of each of the one or more roof sections. An accurate determination of the roof pitch may be employed (by a human or the RES 600) to better determine an accurate cost estimate, as roof sections having a low pitch are typically less costly surfaces to repair and/or replace.

The generated 3D model typically includes a plurality of planar roof sections that each correspond to one of the planar sections of the roof of the building. Each of the planar roof sections in the model has a number of associated dimensions and/or attributes, among them slope, area, and length of each edge of the roof section. Other information may include, whether a roof section edge is in a valley or on a ridge of the roof, the orientation of the roof section, and other information relevant to roof builder (e.g., roof and/or roof section perimeter dimensions and/or outlines). Once a 3D model has been generated to the satisfaction of the roof modeling engine 602 and/or the operator 620, the generated 3D model is stored as model data 606 for further processing by the RES 600. In one embodiment, the generated 3D model is then stored in a quality assurance queue, from which it is reviewed and possibly corrected by a quality control operator.

The report generation engine 603 generates a final roof estimate report based on a 3D model stored as model data 606, and then stores the generated report as report data 607. Such a report typically includes one or more plan (top-down) views of the 3D model, annotated with numerical values for the slope, area, and/or lengths of the edges of at least some of the plurality of planar roof sections of the 3D model of the roof. For example, the example report of FIGS. 5A-5E includes multiple plan views of a generated 3D model of the house 103c. In particular, FIG. 5C shows a first plan view of the 3D model, annotated with dimensions of the edges of each roof section. FIG. 5D shows a second plan view of the same 3D model, annotated with the slope of each roof section. FIG. 5E shows a third plan view of the same 3D model, annotated with the area of each roof section.

In some embodiments, generating a report includes labeling one or more views of the 3D model with annotations that are readable to a human user. Some 3D models include a large number of small roof details, such as dormers or other sections, such that applying uniformly sized, oriented, and positioned labels to roof section views results in a visually cluttered diagram. Accordingly, various techniques may be employed to generate a readable report, including automatically determining an optimal or near-optimal label font size, label position, and/or label orientation, such that the resulting report may be easily read and understood by the customer 615.

In addition, in some embodiments, generating a report includes automatically determining a cost estimate, based on specified costs, such as those of materials, labor, transportation, etc. For example, the customer 615 provides indications of material and labor costs to the RES 600. In response, the report generation engine 603 generates a roof estimate report that includes a cost estimate, based on the costs provided by the customer 615 and the attributes of the particular roof, such as area, pitch, etc.

In one embodiment, the generated report is then provided to a customer. The generated report can be represented, for example, as an electronic file (e.g., a PDF file) or a paper document. In the illustrated example, roof estimate report 632 is transmitted to the customer 615. The customer 615 may be or include any human, organization, or computing system that is the recipient of the roof estimate report 632. The customer 615 may be a property owner, a property manager, a roof construction/repair company, a general contractor, an insurance company, a solar power panel installer, etc. Reports may be transmitted electronically, such as via a network (e.g., as an email, Web page, etc.) or by some shipping mechanism, such as the postal service, a courier service, etc.

In some embodiments, one or more of the 3D models stored as model data 606 are provided directly to the customer, without first being transformed into a report. For example, a 3D model may be exported as a data file, in any acceptable format, that may be consumed or otherwise utilized by some other computing system, such as computer-aided design ("CAD") tool, drawing program, etc.

Figure 7:
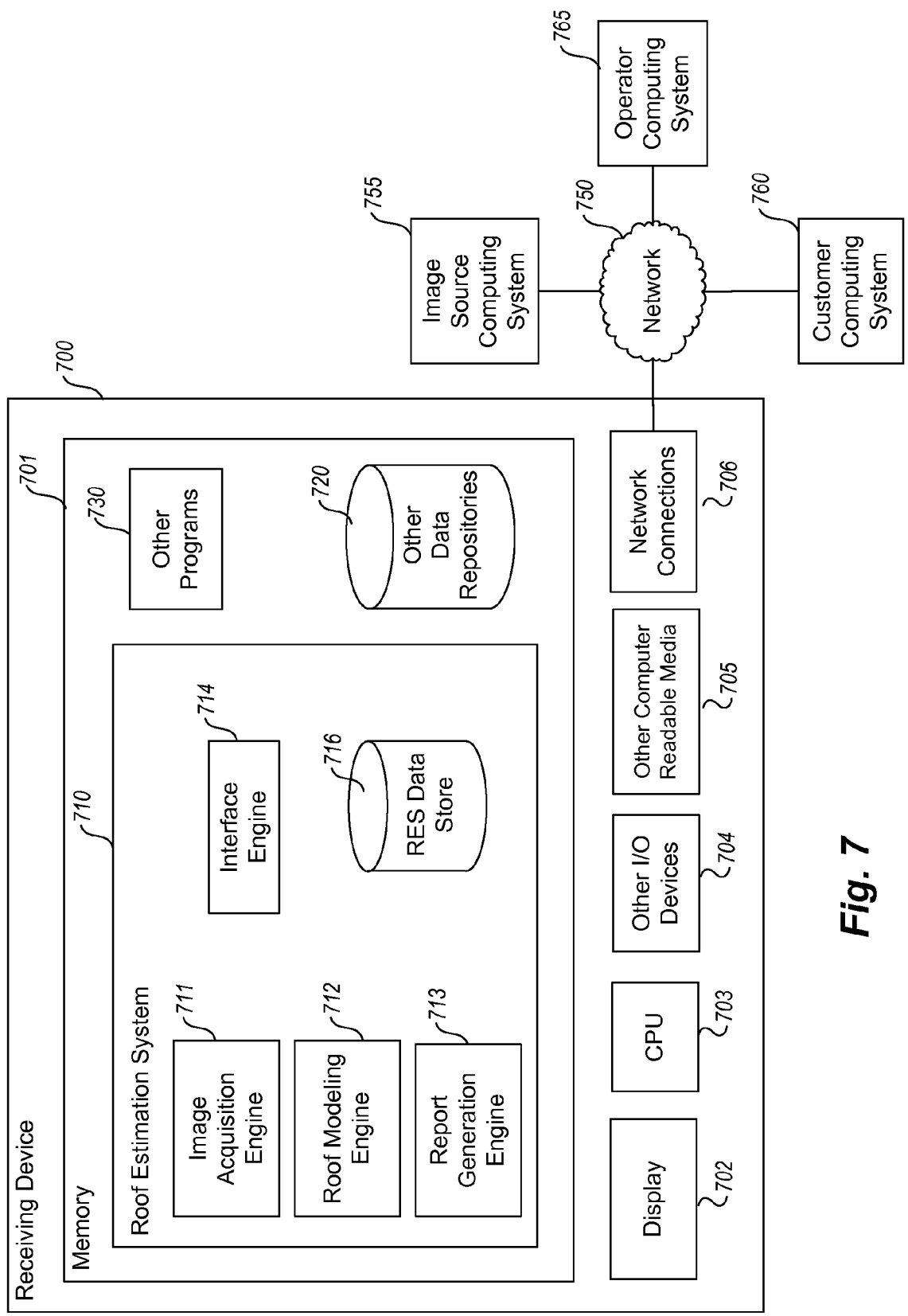
FIG. 7 is an example block diagram of a computing system for practicing embodiments of a roof estimation system.

FIG. 7 is an example block diagram of a computing system for practicing embodiments of a roof estimation system. FIG. 7 shows a computing system 700 that may be utilized to implement a Roof Estimation System ("RES") 710. One or more general purpose or special purpose computing systems may be used to implement the RES 710. More specifically, the computing system 700 may comprise one or more distinct computing systems present at distributed locations. In addition, each block shown may represent one or more such blocks as appropriate to a specific embodiment or may be combined with other blocks. Moreover, the various blocks of the RES 710 may physically reside on one or more machines, which use standard inter-process communication mechanisms (e.g., TCP/IP) to communicate with each other. Further, the RES 710 may be implemented in software, hardware, firmware, or in some combination to achieve the capabilities described herein.

In the embodiment shown, computing system 700 comprises a computer memory ("memory") 701, a display 702, one or more Central Processing Units ("CPU") 703, Input/Output devices 704 (e.g., keyboard, mouse, CRT or LCD display, and the like), other computer-readable media 705, and network connections 706. The RES 710 is shown residing in memory 701. In other embodiments, some portion of the contents, some of, or all of the components of the RES 710 may be stored on and/or transmitted over the other computer-readable media 705. The components of the RES 710 preferably execute on one or more CPUs 703 and generate roof estimate reports, as described herein. Other code or programs 730 (e.g., a Web server, a database management system, and the like) and potentially other data repositories, such as data repository 720, also reside in the memory 710, and preferably execute on one or more CPUs 703. Not all of the components in FIG. 7 are required for each implementation. For example, some embodiments embedded in other software do not provide means for user input, for display, for a customer computing system, or other components.

In a typical embodiment, the RES 710 includes an image acquisition engine 711, a roof modeling engine 712, a report generation engine 713, an interface engine 714, and a roof estimation system data repository 716. Other and/or different modules may be implemented. In addition, the RES 710 interacts via a network 750 with an image source computing system 755, an operator computing system 765, and/or a customer computing system 760.

The image acquisition engine 711 performs at least some of the functions of the image acquisition engine 601 described with reference to FIG. 6. In particular, the image acquisition engine 711 interacts with the image source computing system 755 to obtain one or more images of a building, and stores those images in the RES data repository 716 for processing by other components of the RES 710. In some embodiments, the image acquisition engine 711 may act as an image cache manager, such that it preferentially provides images to other components of the RES 710 from the RES data repository 716, while obtaining images from the image source computing system 755 when they are not already present in the RES data repository 716.

The roof modeling engine 712 performs at least some of the functions of the roof modeling engine 602 described with reference to FIG. 6. In particular, the roof modeling engine 712 generates a 3D model based on one or more images of a building that are obtained from the RES data repository 716. As noted, 3D model generation may be performed semi-automatically, based on at least some inputs received from the computing system 765. In addition, at least some aspects of the 3D model generation may be performed automatically, based on image processing and/or image understanding techniques. After the roof modeling engine 712 generates a 3D model, it stores the generated model in the RES data repository 716 for further processing by other components of the RES 710.

The report generation engine 713 performs at least some of the functions of the report generation engine 603 described with reference to FIG. 6. In particular, the report generation engine 713 generates roof reports based on 3D models stored in the RES data repository 716. Generating a roof report may include preparing one or more views of a given 3D model of a roof, annotating those views with indications of various characteristics of the model, such as dimensions of sections or other features (e.g., ridges, valleys, etc.) of the roof, slopes of sections of the roof, areas of sections of the roof, etc.

The interface engine 714 provides a view and a controller that facilitate user interaction with the RES 710 and its various components. For example, the interface engine 714 provides an interactive graphical user interface that can be used by a human user operating the operator computing system 765 to interact with, for example, the roof modeling engine 612, to perform functions related to the generation of 3D models, such as point registration, feature indication, pitch estimation, etc. In other embodiments, the interface engine 714 provides access directly to a customer operating the customer computing system 760, such that the customer may place an order for a roof estimate report for an indicated building location. In at least some embodiments, access to the functionality of the interface engine 714 is provided via a Web server, possibly executing as one of the other programs 730.

In some embodiments, the interface engine 714 provides programmatic access to one or more functions of the RES 710. For example, the interface engine 714 provides a programmatic interface (e.g., as a Web service, static or dynamic library, etc.) to one or more roof estimation functions of the RES 710 that may be invoked by one of the other programs 730 or some other module. In this manner, the interface engine 714 facilitates the development of third-party software, such as user interfaces, plug-ins, adapters (e.g., for integrating functions of the RES 710 into desktop applications, Web-based applications, embedded applications, etc.), and the like. In addition, the interface engine 714 may be in at least some embodiments invoked or otherwise accessed via remote entities, such as the operator computing system 765, the image source computing system 755, and/or the customer computing system 760, to access various roof estimation functionality of the RES 710.

The RES data repository 716 stores information related the roof estimation functions performed by the RES 710. Such information may include image data 605, model data 606, and/or report data 607 described with reference to FIG. 6. In addition, the RES data repository 716 may include information about customers, operators, or other individuals or entities associated with the RES 710.

In an example embodiment, components/modules of the RES 710 are implemented using standard programming techniques. For example, the RES 710 may be implemented as a "native" executable running on the CPU 703, along with one or more static or dynamic libraries. In other embodiments, the RES 710 is implemented as instructions processed by virtual machine that executes as one of the other programs 730. In general, a range of programming languages known in the art may be employed for implementing such example embodiments, including representative implementations of various programming language paradigms, including but not limited to, object-oriented (e.g., Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, Python, JavaScript, VBScript, and the like), declarative (e.g., SQL, Prolog, and the like).

The embodiments described above may also use well-known synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments execute concurrently and asynchronously, and communicate using message passing techniques. Equivalent synchronous embodiments are also supported by an RES implementation. Also, other functions could be implemented and/or performed by each component/module, and in different orders, and by different components/modules, yet still achieve the functions of the RES.

In addition, programming interfaces to the data stored as part of the RES 710, such as in the RES data repository 716, can be available by standard mechanisms such as through C, C++, C#, and Java APIs; libraries for accessing files, databases, or other data repositories; through scripting languages such as XML; or through Web servers, FTP servers, or other types of servers providing access to stored data. For example, the RES data repository 716 may be implemented as one or more database systems, file systems, memory buffers, or any other technique for storing such information, or any combination of the above, including implementations using distributed computing techniques.

Also, the example RES 710 can be implemented in a distributed environment comprising multiple, even heterogeneous, computer systems and networks. For example, in one embodiment, the image acquisition engine 711, the roof modeling engine 712, the report generation engine 713, the interface engine 714, and the data repository 716 are all located in physically different computer systems. In another embodiment, various modules of the RES 710 are hosted each on a separate server machine and are remotely located from the tables which are stored in the data repository 716. Also, one or more of the modules may themselves be distributed, pooled or otherwise grouped, such as for load balancing, reliability or security reasons. Different configurations and locations of programs and data are contemplated for use with techniques of described herein. A variety of distributed computing techniques are appropriate for implementing the components of the illustrated embodiments in a distributed manner including but not limited to TCP/IP sockets, RPC, RMI, HTTP, Web Services (XML-RPC, JAX-RPC, SOAP, and the like).

Furthermore, in some embodiments, some or all of the components of the RES are implemented or provided in other manners, such as at least partially in firmware and/or hardware, including, but not limited to one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), and the like Some or all of the system components and/or data structures may also be stored (e.g., as software instructions or structured data) on a computer-readable medium, such as a hard disk, a memory, a network, or a portable media article to be read by an appropriate drive or via an appropriate connection. The system components and data structures may also be stored as data signals (e.g., by being encoded as part of a carrier wave or included as part of an analog or digital propagated signal) on a variety of computer-readable transmission mediums, which are then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced with other computer system configurations.

Figure 8:
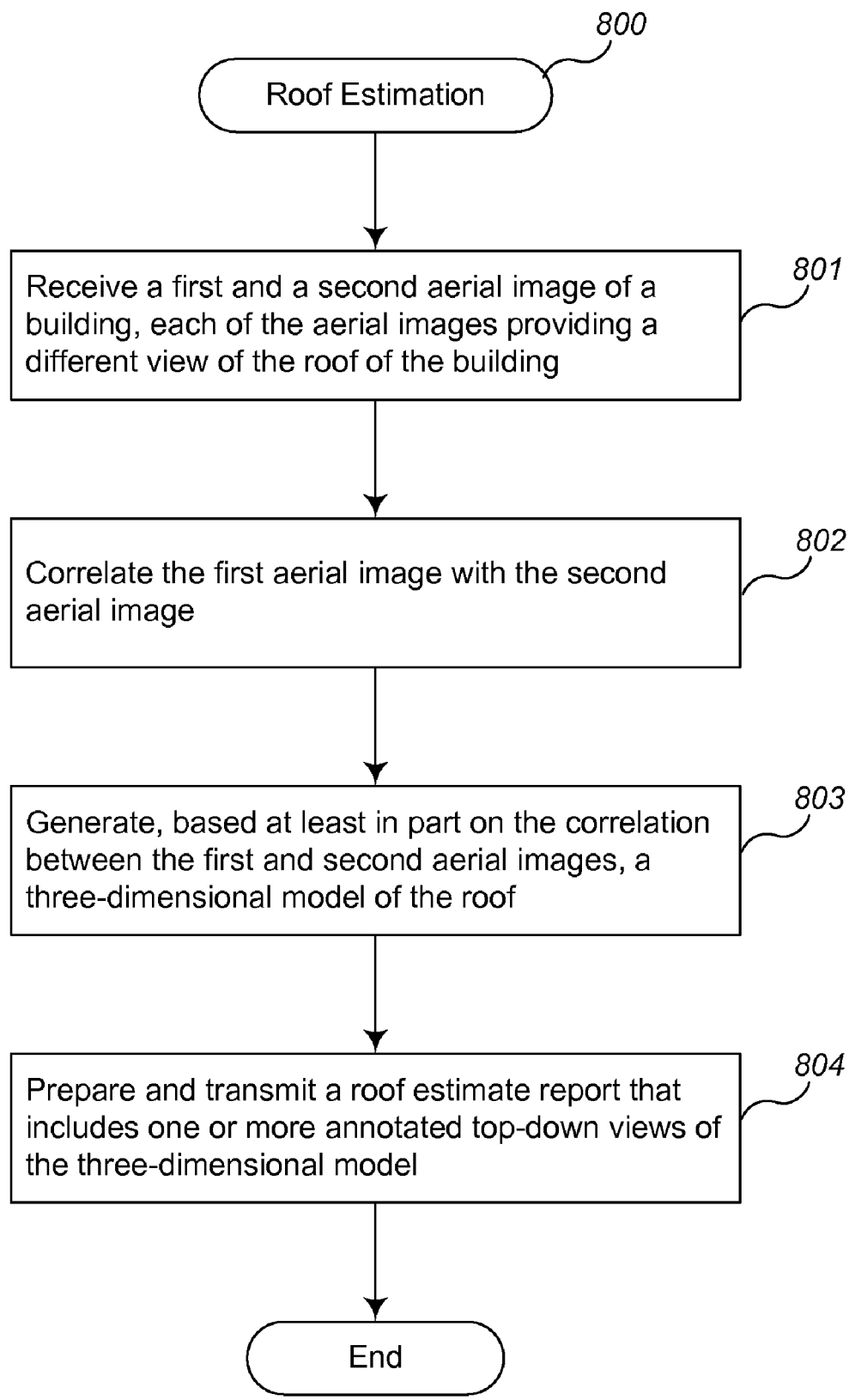
FIG. 8 is an example flow diagram of a first example roof estimation routine provided by an example embodiment.

FIG. 8 is an example flow diagram of a first example roof estimation routine provided by an example embodiment. The illustrated routine 800 may be provided by, for example, execution of the roof estimation system 710 described with respect to FIG. 7. The illustrated routine 800 generates a 3D model of a roof of a building, based on two or more aerial images of the building, and further prepares and transmits a roof estimate report based on the 3D model.

More specifically, the routine begins at step 801 where it receives a first and a second aerial image of a building, each of the aerial images providing a different view of the roof of the building. The aerial images may be received from, for example, the image source computing system 755 and/or from the RES data repository 716 described with reference to FIG. 7. As discussed above, aerial images may be originally created by cameras mounted on airplanes, balloons, satellites, etc. In some embodiments, images obtained from ground-based platforms (e.g., vehicle-mounted cameras) may be used instead or in addition.

In step 802, the routine correlates the first aerial image with the second aerial image. In some embodiments, correlating the aerial images may include registering pairs of points on the first and second aerial images, each pair of points corresponding to substantially the same point on the roof depicted in each of the images. Correlating the aerial images may be based at least in part on input received from a human operator and/or automatic image processing techniques.

In step 803, the routine generates, based at least in part on the correlation between the first and second aerial images, a three-dimensional model of the roof. The three-dimensional model of the roof may include a plurality of planar roof sections that each have a corresponding slope, area, and perimeter. Generating the three-dimensional model may be based at least in part indications of features of the roof, such as valleys, ridges, edges, planes, etc. Generating the three-dimensional model may also be based at least in part on input received from a human operator (e.g., indications of roof ridges and valleys) and/or automatic image processing techniques.

In step 804, the routine prepares (e.g., generates, determines, produces, etc.) and transmits a roof estimate report that includes one or more annotated top-down views of the three-dimensional model. In some embodiments, the annotations include numerical values indicating the slope, area, and lengths of the edges of the perimeter of at least some of the plurality of planar roof sections of the three-dimensional model of the roof. The roof estimate report may be an electronic file that includes images of the building and/or its roof, as well as line drawings of one or more views of the three-dimensional model of the building roof. Preparing the report may include annotating the report with labels that are sized and oriented in a manner that preserves and/or enhances readability of the report. For example, labels on a particular line drawing may be sized based at least in part on the size of the feature (e.g., roof ridge line) that they are associated with, such that smaller features are annotated with smaller labels so as to preserve readability of the line drawing by preventing or reducing the occurrence of labels that overlap with other portions (e.g., lines, labels, etc.) of the line drawing. The roof estimate report may be transmitted to various destinations, such as directly to a customer or computing system associated with that customer, a data repository, and/or a quality assurance queue for inspection and/or improvement by a human operator.

After step 804, the routine ends. In other embodiments, the routine may instead return to step 801, to generate another roof estimate report for another building. Note that the illustrated routine may be performed interactively, such as based at least in part on one or more inputs received from a human operator, or in batch mode, such as for performing automatic, bulk generation of roof estimate reports.

Figure 9:
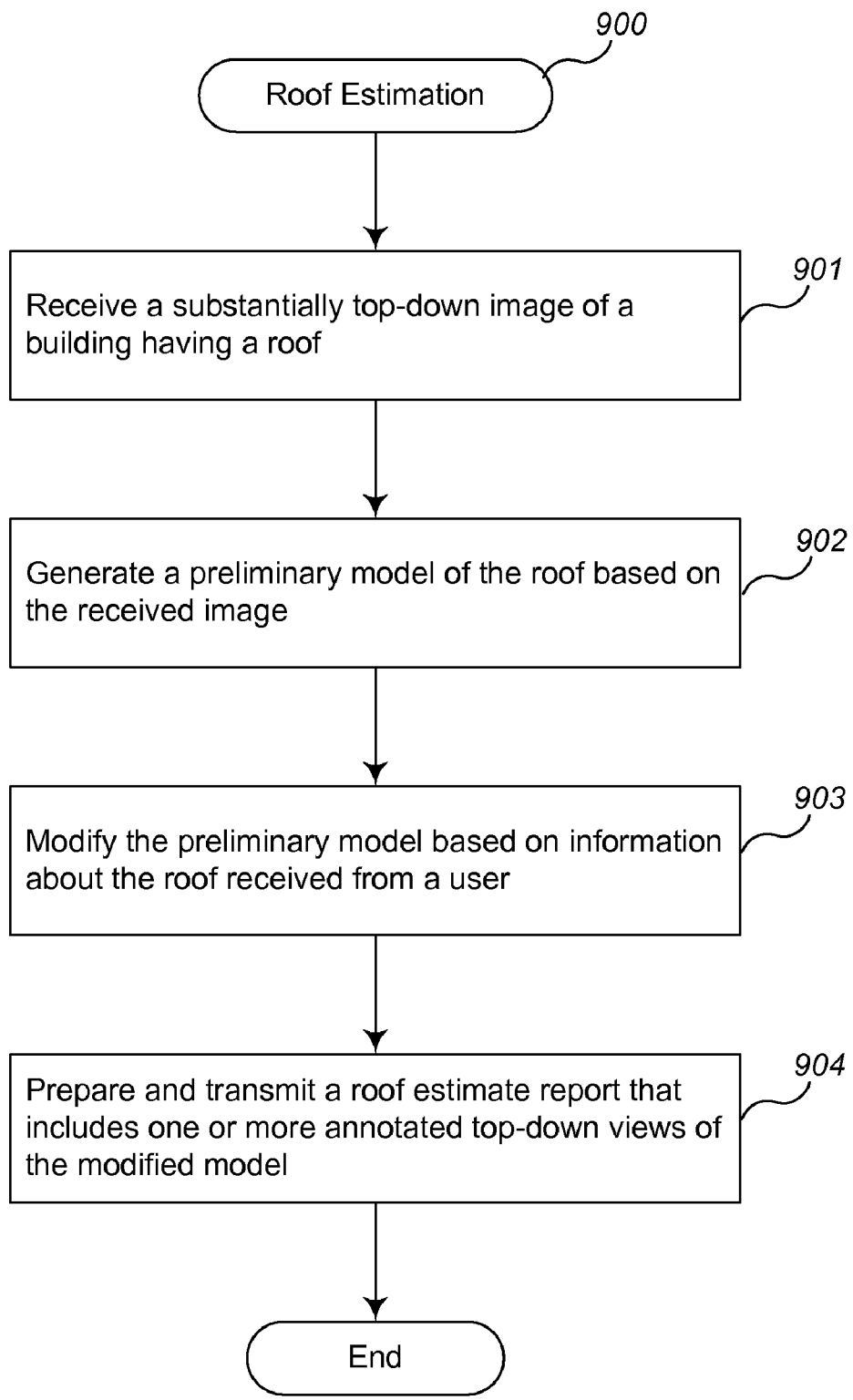
FIG. 9 is an example flow diagram of a second example roof estimation routine provided by an example embodiment.

FIG. 9 is an example flow diagram of a second example roof estimation routine provided by an example embodiment. The illustrated routine 900 may be provided by, for example, execution of the roof estimation system 710 described with respect to FIG. 7. The illustrated routine 900 generates a roof estimate report based on a single aerial image and additional information received from a user, such as information about the pitch of various roof sections.

In step 901, the routine receives a substantially top-down aerial image of a building having a roof. Such an aerial image may be obtained from, for example, a satellite or aircraft.

In step 902, the routine generates a preliminary model of the roof based on the received aerial image. The preliminary roof model may be a two-dimensional ("flat") model that includes information about the perimeter of the roof and at least some of its corresponding planar roof sections. Such a preliminary roof model may include estimates of various dimensions of the roof, such as edge lengths and/or section areas. In some cases, the preliminary roof model does not include information related to the pitch of various roof sections.

In step 903, the routine modifies the preliminary model based on additional information about the roof received from a user. For example, the preliminary model may be presented to a user (e.g., a customer, an operator, etc.), by displaying a representation of the model, such as a line drawing. In response, the user provides the routine with pitch information and/or feature identification (e.g., of ridges and/or valleys), etc. Such user-supplied information is then incorporated into the preliminary roof model to obtain a modified (refined) roof model. In some cases, the user supplies the additional information via a Web-base interface that provides access to the routine.

In step 904, the routine prepares and transmits a roof estimate report that includes one or more annotated views of the modified model. As discussed above, the annotations may include numerical values indicating the slope, area, and lengths of the edges of the perimeter of at least some of the roof sections of the roof. After step 904, the routine ends.

The routines 800 and 900 may be used in conjunction to advantageously offer customers roof estimate reports at differing price points. For example, routine 800 can be utilized as part of a "premium" service that offers a customer with a more accurate roof estimate report for minimal effort on the customer's part. Routine 900 can be utilized as part of an "economy" service that offers a customer a less accurate roof estimate report at a lower price, but that may be further refined with additional effort from the customer.

From the foregoing it will be appreciated that, although specific embodiments have been described herein for purposes of illustration, various modifications may be made without deviating from the spirit and scope of the present disclosure. For example, the methods, systems, and techniques for generating and providing roof estimate reports discussed herein are applicable to other architectures other than the illustrated architecture or a particular roof estimation system implementation. Also, the methods and systems discussed herein are applicable to differing network protocols, communication media (optical, wireless, cable, etc.) and devices (such as wireless handsets, electronic organizers, personal digital assistants, portable email machines, game machines, pagers, navigation devices such as GPS receivers, etc.). Further, the methods and systems discussed herein may be utilized by and/or applied to other contexts or purposes, such as by or for solar panel installers, roof gutter installers, awning companies, HVAC contractors, general contractors, and/or insurance companies.

The invention claimed is:

1. A computing system for generating a roof estimate report, the computing system comprising:
a memory;
a roof estimation module that is stored on the memory and that is configured, when executed, to:
receive a first and a second aerial image of a building having a roof, each of the aerial images providing a different view of the roof of the building;
correlate the first aerial image with the second aerial image;
generate, based at least in part on the correlation between the first and second aerial images, a three-dimensional model of the roof that includes a plurality of planar roof sections that each have a corresponding slope, area, and edges; and
generate and transmit a roof estimate report that includes one or more top plan views of the three-dimensional model annotated with numerical values that indicate the corresponding slope, area, and length of edges of at least some of the plurality of planar roof sections using at least two different indicia for different types of roof properties.

2. The computing system of claim 1 wherein the roof estimation module is further configured to correlate the first and second aerial images by receiving an indication of one or more corresponding points on the building shown in each of the first and second aerial images.

3. The computing system of claim 1 wherein the roof estimation module is further configured to generate the three-dimensional model by receiving an indication of at least one of a ridgeline of the roof, a valley of the roof, an edge of the roof, a hip of the roof, and a gable of the roof.

4. The computing system of claim 1 wherein the roof estimation module is further configured to receive the first and second aerial image from an image source computing system.

5. The computing system of claim 1 wherein the roof estimation module is further configured to generate the roof estimate report by generating an electronic file that includes an image of the building along with line drawings of the one or more top plan views of the three-dimensional model.

6. The method of claim 1 wherein transmitting the roof estimate report includes initiating printing of the one or more top plan views of the three-dimensional model.

7. The computing system of claim 1 wherein the different types of roof properties include different roof measurements, and the at least two different indicia include at least one of: length, slope, and area.

8. The computing system of claim 7 wherein the length is located adjacent to a line representing a segment, the slope is located next to an arrow indicating direction of the slope and the area is located within a section having the area.

9. The computing system of claim 1 wherein the different types of roof properties include different roof features, and the at least two different indicia include different graphical representations of the different roof features.

10. The computing system of claim 1 wherein the different types of roof properties include a ridge line and a valley line and the at least two different indicia include one color of a line associated with a ridge and a different color of a line associated with a valley.

11. The computing system of claim 1 wherein the different types of roof properties include at least one of: a roof section, a roof segment, a roof valley, a ridge, a roof size, a roof geometry, a roof measurement, a roof dimension, slope, length and area.

12. The computing system of claim 1 wherein the at least two different indicia include at least one of: different line color, different line weight, different visual characteristics of a line, different characters, different color of characters, different visual characteristics of characters, different measurements, different visual characteristics of measurements, different placement of measurements with respect to lines, different symbols, different visual characteristics of symbols and different placement of measurements with respect to symbols.

13. The computing system of claim 1 wherein the different types of roof properties include a ridge length and a valley length and the at least two different indicia include one color of a line associated with a ridge and a different color of a line associated with a valley.

14. The computing system of claim 13 wherein the one color of the line associated with the ridge is red and the different color of the line associated with the valley is blue.

15. The computing system of claim 1 wherein the different types of roof properties include a ridge and the at least two different indicia include a ridge length indicia, wherein the ridge length indicia is a ridge line with a numerical value adjacent thereto.

16. The computing system of claim 1 wherein the different types of roof properties include a valley and the at least two different indicia include a valley length indicia, wherein the valley length indicia is a valley line with a numerical value adjacent thereto.

17. The computing system of claim 1 wherein the different types of roof properties include a slope and the at least two different indicia include a slope indicia, wherein the slope indicia is an arrow in a direction of the slope with a numerical value adjacent thereto.

18. A computer-implemented method for generating a roof estimate, the method comprising:
receiving a first and a second aerial image of a building having a roof, each of the aerial images providing a different view of the roof of the building;
correlating the first aerial image with the second aerial image;
generating, based at least in part on the correlation between the first and second aerial images, a three-dimensional model of the roof that includes a plurality of planar roof sections that each have a corresponding slope, area, and edges; and
transmitting a roof estimate report that includes one or more top plan views of the three-dimensional model annotated with numerical indications of at least one of the slope, area, and lengths of the edges of the plurality of planar roof sections, wherein the roof estimate report includes at least two different indicia for different types of roof properties.

19. The method of claim 18 wherein identifying the building includes receiving a street address of the building.

20. The method of claim 18 wherein correlating the first and second aerial images includes receiving an indication of one or more corresponding points shown in each of the first and second aerial images.

21. The method of claim 20 wherein receiving the indication of the corresponding point includes receiving the indication from a user.

22. The method of claim 18 wherein generating the three-dimensional model includes receiving an indication of at least one of a ridgeline of the roof, a valley of the roof, an edge of the roof, a hip of the roof, and a gable of the roof.

23. The method of claim 18, further comprising generating the roof estimate report, the roof estimate report being a data file that includes an image of the building along with line drawings of the one or more top plan views of the three-dimensional model.

24. The method of claim 18 wherein transmitting the roof estimate report includes transmitting a data file that includes the one or more top plan views of the three-dimensional model.

25. The method of claim 18 wherein the different types of roof properties include different roof measurements, and the at least two different indicia include at least one of: length, slope, and area.

26. The method of claim 25 wherein the length is located adjacent to a line representing a segment, the slope is located next to an arrow indicating direction of the slope and the area is located within a section having the area.

27. The method of claim 18 wherein the different types of roof properties include different roof features, and the at least two different indicia include different graphical representations of the different roof features.

28. The method of claim 18 wherein the different types of roof properties include a ridge line and a valley line and the at least two different indicia include one color of a line associated with a ridge and a different color of a line associated with a valley.

29. The method of claim 18 wherein the different types of roof properties include at least one of: a roof section, a roof segment, a roof valley, a ridge, a roof size, a roof geometry, a roof measurement, a roof dimension, slope, length and area.

30. The method of claim 18 wherein the at least two different indicia include at least one of: different line color, different line weight, different visual characteristics of a line, different characters, different color of characters, different visual characteristics of characters, different measurements, different visual characteristics of measurements, different placement of measurements with respect to lines, different symbols, different visual characteristics of symbols and different placement of measurements with respect to symbols.

31. The method of claim 18 wherein the different types of roof properties include a ridge length and a valley length and the at least two different indicia include one color of a line associated with a ridge and a different color of a line associated with a valley.

32. The method of claim 31 wherein the one color of the line associated with the ridge is red and the different color of the line associated with the valley is blue.

33. The method of claim 18 wherein the different types of roof properties include a ridge and the at least two different indicia include a ridge length indicia, wherein the ridge length indicia is a ridge line with a numerical value adjacent thereto.

34. The method of claim 18 wherein the different types of roof properties include a valley and the at least two different indicia include a valley length indicia, wherein the valley length indicia is a valley line with a numerical value adjacent thereto.

35. The method of claim 18 wherein the different types of roof properties include a slope and the at least two different indicia include a slope indicia, wherein the slope indicia is an arrow in a direction of the slope with a numerical value adjacent thereto.

36. A non-transitory computer-readable storage medium whose contents enable a computing system to generate a roof estimate report for a building having a roof, by performing a method comprising:
receiving one or more images of the building;
generating, based on the one or more images of the building, a model of the roof that includes a plurality of planar roof sections that each have a corresponding area and edges; and
transmitting a roof estimate report that includes one or more views of the model, the report being annotated with numerical indications of the area and lengths of the edges of at least some of the plurality of planar roof sections, wherein the roof estimate report includes at least two different indicia for different types of roof properties.

37. The non-transitory computer-readable storage medium of claim 36 wherein generating the model includes generating a three-dimensional model based on a correlation between two of the one or more images.

38. The non-transitory computer-readable storage medium of claim 36 wherein the method further comprises generating the roof estimate report, the roof estimate report including annotated line drawings of each of the one or more views of the model.

39. The non-transitory computer-readable storage medium of claim 36 wherein the one or more images of the building are images obtained from at least one of an aircraft, satellite, and ground-based platform, and wherein the one or more views of the model are top-down line drawing views of the model.

40. The non-transitory computer-readable storage medium of claim 36 wherein generating the model of the roof includes automatically identifying at least some features of the roof for inclusion in the model.

41. The non-transitory computer-readable storage medium of claim 36 wherein the contents are instructions that when executed cause the computing system to perform the method.

42. The non-transitory computer-readable storage medium of claim 36 wherein the method further comprises transmitting to a remote computing system a computer-readable data file that includes a representation of the model.

43. The non-transitory computer-readable storage medium of claim 36 wherein generating the model of the roof includes generating a two-dimensional model of the roof based on a single image that provides a substantially top-down view of the roof.

44. The non-transitory computer-readable storage medium of claim 43 further comprising:
presenting the model to a customer; and
modifying the model of the roof based on input received from the customer, the input indicating a slope corresponding to one of the plurality of planar roof sections, wherein transmitting the roof estimate report includes generating a roof estimate report based on the modified model.

45. The non-transitory computer-readable storage medium of claim 43 further comprising:
modifying the model of the roof based on input received from a customer, the input identifying a ridge or valley of the roof, wherein transmitting the roof estimate report includes generating a roof estimate report based on the modified model.

46. The non-transitory computer-readable storage medium of claim 36 wherein the different types of roof properties include different roof measurements, and the at least two different indicia include at least one of: length, slope, and area.

47. The non-transitory computer-readable storage medium of claim 46 wherein the length is located adjacent to a line representing a segment, the slope is located next to an arrow indicating direction of the slope and the area is located within a section having the area.

48. The non-transitory computer-readable storage medium of claim 36 wherein the different types of roof properties include different roof features, and the at least two different indicia include different graphical representations of the different roof features.

49. The non-transitory computer-readable storage medium of claim 36 wherein the different types of roof properties include a ridge line and a valley line and the at least two different indicia include one color of a line associated with a ridge and a different color of a line associated with a valley.

50. The non-transitory computer-readable storage medium of claim 36 wherein the different types of roof properties include at least one of: a roof section, a roof segment, a roof valley, a ridge, a roof size, a roof geometry, a roof measurement, a roof dimension, slope, length and area.

51. The non-transitory computer-readable storage medium of claim 36 wherein the at least two different indicia include at least one of: different line color, different line weight, different visual characteristics of a line, different characters, different color of characters, different visual characteristics of characters, different measurements, different visual characteristics of measurements, different placement of measurements with respect to lines, different symbols, different visual characteristics of symbols and different placement of measurements with respect to symbols.

52. The non-transitory computer-readable storage medium of claim 36 wherein the different types of roof properties include a ridge length and a valley length and the at least two different indicia include one color of a line associated with a ridge and a different color of a line associated with a valley.

53. The non-transitory computer-readable storage medium of claim 52 wherein the one color of the line associated with the ridge is red and the different color of the line associated with the valley is blue.

54. The non-transitory computer-readable storage medium of claim 36 wherein the different types of roof properties include a ridge and the at least two different indicia include a ridge length indicia, wherein the ridge length indicia is a ridge line with a numerical value adjacent thereto.

55. The non-transitory computer-readable storage medium of claim 36 wherein the different types of roof properties include a valley and the at least two different indicia include a valley length indicia, wherein the valley length indicia is a valley line with a numerical value adjacent thereto.

56. The non-transitory computer-readable storage medium of claim 36 wherein the different types of roof properties include a slope and the at least two different indicia include a slope indicia, wherein the slope indicia is an arrow in a direction of the slope with a numerical value adjacent thereto.

* * * * *

US008078436C1

(12) EX PARTE REEXAMINATION CERTIFICATE (11th)
Ex Parte Reexamination Ordered under 35 U.S.C. 257

United States Patent
Pershing et al.

(10) Number: US 8,078,436 C1
(45) Certificate Issued: Aug. 27, 2014

(54) AERIAL ROOF ESTIMATION SYSTEMS AND METHODS

(75) Inventors: Chris Pershing, Bellevue, WA (US); David P. Carlson, Woodinville, WA (US)

(73) Assignee: Eagle View Technologies, Inc., Redmond, WA (US)

Supplemental Examination Request:
No. 96/000,004, Dec. 28, 2012

Reexamination Certificate for:
Patent No.: 8,078,436
Issued: Dec. 13, 2011
Appl. No.: 12/253,092
Filed: Oct. 16, 2008

Related U.S. Application Data

(63) Continuation-in-part of application No. 12/148,439, filed on Apr. 17, 2008, now Pat. No. 8,145,578.

(60) Provisional application No. 60/925,072, filed on Apr. 17, 2007.

(51) Int. Cl.
*G06F 7/60* (2006.01)
*G06F 17/10* (2006.01)
*G06Q 30/02* (2012.01)
*G06T 17/20* (2006.01)

(52) U.S. Cl.
CPC ............... *G06Q 30/02* (2013.01); *G06T 17/20* (2013.01); *G06Q 30/0283* (2013.01); *G06T 2200/08* (2013.01)
USPC ............................................................ 703/2

(58) Field of Classification Search
None
See application file for complete search history.

(56) References Cited

To view the complete listing of prior art documents cited during the supplemental examination proceeding and the resulting reexamination proceeding for Control Number 96/000,004, please refer to the USPTO's public Patent Application Information Retrieval (PAIR) system under the Display References tab.

*Primary Examiner* — Jason Proctor

(57) ABSTRACT

Methods and systems for roof estimation are described. Example embodiments include a roof estimation system, which generates and provides roof estimate reports annotated with indications of the size, geometry, pitch and/or orientation of the roof sections of a building. Generating a roof estimate report may be based on one or more aerial images of a building. *The slope and orientation images are typically oblique perspective views and top plan views of the buildings in the area.* In some embodiments, generating a roof estimate report of a specified building roof may include generating a three-dimensional model of the roof, and generating a report that includes one or more views of the three-dimensional model, the views annotated with indications of the dimensions, area, and/or slope of sections of the roof. This abstract is provided to comply with rules requiring an abstract, and it is submitted with the intention that it will not be used to interpret or limit the scope or meaning of the claims.

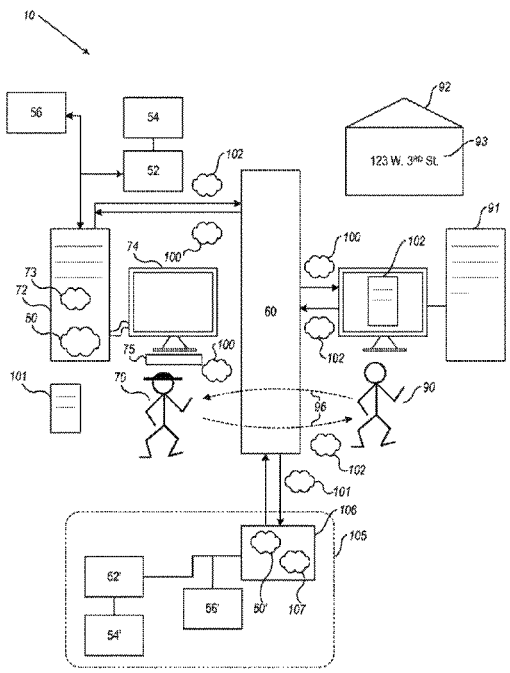

US 8,078,436 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 43-45 are cancelled.

Claims 1, 18, 36, 37 and 41 are determined to be patentable as amended.

Claims 2-17, 19-35, 38-40, 42 and 46-56, dependent on an amended claim, are determined to be patentable.

New claims 57-66 are added and determined to be patentable.

1. A computing system for generating a roof estimate report, the computing system comprising:
   a memory;
   a roof estimation module that is stored on the memory and that is configured, when executed, to:
      receive a first and a second aerial image of a building having a roof, each of the aerial images providing a different view of the roof of the building, *wherein the first aerial image provides a top plan view of the roof and the second aerial image provides an oblique perspective view of the roof, and are not a stereoscopic pair*;
      correlate the first aerial image with the second aerial image;
      generate, based at least in part on the correlation between the first and second aerial images, a three-dimensional model of the roof that includes a plurality of planar roof sections that each have a corresponding slope, area, and edges; and
      generate and transmit a roof estimate report that includes one or more top plan views of the three-dimensional model annotated with numerical values that indicate the corresponding slope, area, and length of edges of at least some of the plurality of planar roof sections using at least two different indicia for different types of roof properties.

18. A computer-implemented method for generating a roof estimate, the method comprising:
   receiving a first and a second aerial image of a building having a roof, each of the aerial images providing a different view of the roof of the building *wherein the first aerial image provides a top plan view of the roof and the second aerial image provides a view of the roof that is other than a top plan view and neither of the two images are part of a stereoscopic pair*;
   correlating the first aerial image with the second aerial image;
   generating, based at least in part on the correlation between the first and second aerial images, a three-dimensional model of the roof that includes a plurality of planar roof sections that each have a corresponding slope, area, and edges; and
   transmitting a roof estimate report that includes one or more top plan views of the three-dimensional model annotated with numerical indications of at least one of the slope, area, and lengths of the edges of the plurality of planar roof sections, wherein the roof estimate report includes at least two different indicia for different types of roof properties.

36. A non-transitory computer-readable storage medium whose contents, *which are computer executable instructions stored on the non-transitory computer-readable storage medium, when executed by a computer processor of a computing system,* enable [a] *the* computing system to generate a roof estimate report for a building having a roof, by [performing] *causing, when executed by the computer processor of the computing system, the computing system to perform* a method comprising:
   receiving [one] *two* or more images of the building, *wherein at least one of the two or more images provides an oblique perspective view of the roof and one of the images provides a top plan view of the roof;*
   *receiving an indication of pairs of points on the two or more images, each pair of points corresponding to substantially the same point on the roof depicted in each of the two or more images;*
   generating, based on the [one] *two* or more images of the building, a *three-dimensional* model of the roof that includes a plurality of planar roof sections that each have a corresponding area and edges, *wherein the generating, based on the two or more images of the building, the model of the roof includes generating the model of the roof based on the receiving the indication of the pairs of points on the two or more images of the building*; and
   transmitting a roof estimate report that includes one or more views of the model, the report being annotated with numerical indications of the area and lengths of the edges of at least some of the plurality of planar roof sections, wherein the roof estimate report includes at least two different indicia for different types of roof properties.

37. The non-transitory computer-readable storage medium of claim 36 wherein generating the model *of the roof based on the receiving the indication of the pairs of points on the two or more images* includes*:*
   *correlating two of the two or more images by registering the pairs of points; and*
   generating [a] *the* three-dimensional model based on [a] *the* correlation between *the* two of the [one] *two* or more images.

41. The non-transitory computer-readable storage medium of claim 36 wherein the contents are instructions that when executed cause the computing system to perform *the receiving two or more images step of* the method *by causing, when executed by the computer processor of the computing system, the computing system to provide access to a repository of aerial images of one or more buildings*.

*57. The method according to 18 wherein the second aerial image provides an oblique perspective view of the roof.*

*58. A computer-implemented method for generating a roof estimate, the method comprising:*
   *receiving a first aerial image of a building having a type of view of the roof that is a top plan view of the roof;*
   *receiving a second aerial image of the building having a type of view of the roof that is a perspective oblique view of the roof;*
   *receiving a third aerial image having a type of view of the roof that is an oblique perspective from a different direc-* tion than the second aerial image, each of the aerial images providing a different view of the roof of the building;

correlating the first aerial image with the second aerial image and third aerial images;

generating, based at least in part on the correlation between the first, second and third aerial images, a three-dimensional model of the roof that includes a plurality of planar roof sections that each have a corresponding slope, area, and edges; and transmitting a roof estimate report that includes one or more top plan views of the three-dimensional model annotated with numerical indications of at least one of the slope, area, and lengths of the edges of the plurality of planar roof sections, wherein the roof estimate report includes at least two different indicia for different types of roof properties.

59. The method of claim 58 wherein the different types of roof properties include a ridge line and a valley line and the at least two different indicia include one color of a line conveying the meaning of a roof ridge and a different color of a line conveying the meaning of roof valley.

60. A computer-implemented method for generating a roof estimate, the method comprising:

receiving a first aerial image of a building;

receiving a second aerial image of the building having the roof;

receiving a third aerial image of the building, each of the aerial images providing a different view of the roof of the building;

correlating the first aerial image with the second aerial image and third aerial image;

generating, based at least in part on the correlation between the first, second and third aerial images, a three-dimensional model of the roof that includes a plurality of planar roof sections that each have a corresponding slope, area, and edges; and generating and transmitting a roof estimate report that includes one or more top plan views of the three-dimensional model annotated with numerical indications of at least one of the slope, area, and lengths of the edges of the plurality of planar roof sections, wherein the roof estimate report includes at least two different indicia for different types of roof properties.

61. The method of claim 60 wherein the correlating the first aerial image with the second and third aerial image includes receiving an indication of pairs of points on each of the images corresponding to substantially the same point on the roof depicted in each of the images.

62. The method of claim 61 wherein the correlating the first aerial image with the second and third aerial image further includes registering the pairs of points and the generating the three-dimensional model includes generating the three-dimensional model based on the registering of the pairs of points.

63. A computer-implemented method for generating a roof estimate, the method comprising:

receiving a request for a roof estimate report for the roof of the building;

receiving location information regarding the building;

receiving a first aerial image of the building having the roof;

receiving a second aerial image of the building having the roof, the first and second images of the roof being independent of each in the views provided of the roof, each of the aerial images providing a different view of the roof of the building;

correlating the first aerial image with the second aerial image;

generating, based at least in part on the correlation between the first and second aerial images, a three-dimensional model of the roof that includes a plurality of planar roof sections that each have a corresponding pitch, area, and edges;

determining a pitch of a plurality of sections of the roof;

determining a direction of the pitch for each of the plurality of sections of the roof for which a pitch was determined;

generating a roof estimate report that includes a top plan views of the three-dimensional model annotated with numerical indications of the determined pitch and the direction of the pitch;

displaying on at least one top plan view a graphical indication of the pitch value of the respective roof sections that conveys the pitch value;

determining a ridge line and a valley line of the roof;

displaying on at least one top plan view a ridge line in which the property of it being a ridge line is conveyed by it being displayed in a first color and a valley line in which the property of it being a valley line is convey by it being in a second color, different from the first color; and transmitting the generated roof report.

64. The method of claim 63 further comprising:

displaying on at least one top plan view of the roof a graphical indication of the pitch direction of the respective roof sections that conveys the direction of the pitch.

65. The method of claim 63 wherein the top plan view showing the pitch value is a different top plan view than the one showing the ridge line and the valley line.

66. The method of claim 65 wherein the correlating the first aerial image with the second aerial image further includes registering pairs of points and the generating the three-dimensional model includes generating the three-dimensional model based on the registering of the pairs of points.

* * * * *